US008456200B2

(12) United States Patent
Sato et al.

(10) Patent No.: US 8,456,200 B2
(45) Date of Patent: Jun. 4, 2013

(54) GATE SIGNAL LINE DRIVE CIRCUIT AND DISPLAY DEVICE

(75) Inventors: Hideo Sato, Hitachi (JP); Masahiro Maki, Mobara (JP); Hiroyuki Abe, Chiba (JP)

(73) Assignees: Hitachi Displays, Ltd., Chiba (JP); Panasonic Liquid Crystal Display Co., Ltd., Hyogo (JP)

( * ) Notice: Subject to any disclaimer, the term of this patent is extended or adjusted under 35 U.S.C. 154(b) by 63 days.

(21) Appl. No.: 13/253,202

(22) Filed: Oct. 5, 2011

(65) Prior Publication Data

US 2012/0086477 A1 Apr. 12, 2012

(30) Foreign Application Priority Data

Oct. 8, 2010 (JP) ................................ 2010-228672

(51) Int. Cl.
*H03B 1/00* (2006.01)
*H03K 3/00* (2006.01)

(52) U.S. Cl.
USPC ................ 327/108; 327/112; 326/24; 326/28

(58) Field of Classification Search
USPC ...... 327/108–112, 379, 389, 391; 326/22–27, 326/81–87
See application file for complete search history.

(56) References Cited

U.S. PATENT DOCUMENTS

| | | | | |
|---|---|---|---|---|
| 5,859,630 | A | 1/1999 | Huq | |
| 7,259,593 | B2 * | 8/2007 | Miyazawa | 326/83 |
| 2006/0138600 | A1 * | 6/2006 | Miyazawa | 257/630 |
| 2009/0115792 | A1 | 5/2009 | Otose et al. | |
| 2011/0273407 | A1 * | 11/2011 | Chung et al. | 345/204 |
| 2012/0081409 | A1 * | 4/2012 | Chung | 345/690 |
| 2012/0162187 | A1 * | 6/2012 | Lee et al. | 345/212 |

FOREIGN PATENT DOCUMENTS

| | | |
|---|---|---|
| JP | 2001-506044 | 5/2001 |
| JP | 2009-134845 | 6/2009 |

* cited by examiner

*Primary Examiner* — Lincoln Donovan
*Assistant Examiner* — Brandon S Cole
(74) *Attorney, Agent, or Firm* — Antonelli, Terry, Stout & Kraus, LLP.

(57) ABSTRACT

Provided is a gate signal line driving circuit including: 2n clock signal lines where 2n-phase clock signals are input in the normal order of the sequence in normal-directional scanning and in the inverse order of the sequence in inverse-directional scanning, respectively; and a plurality of basic circuits, each being connected with the 2n clock signal lines and outputting a gate signal from an output terminal, in which each of the basic circuits includes a high-voltage applying switching circuit where one clock signal line is connected to an input side and applies a voltage applied to the clock signal line to the output terminal and an off-signal applying switching circuit that applies an off-voltage to a switch of the high-voltage applying switching circuit, and a clock signal line where a clock signal having an inverse phase is connected to a switch of the off-signal applying switching circuit.

19 Claims, 14 Drawing Sheets

GATE SIGNAL LINE DRIVE CIRCUIT AND DISPLAY DEVICE

CROSS-REFERENCE TO RELATED APPLICATION

The present application claims priority from Japanese application JP 2010-228672 filed on Oct. 8, 2010, the content of which is hereby incorporated by reference into this application.

BACKGROUND OF THE INVENTION

1. Field of the Invention

The present invention relates to a gate signal line driving circuit and a display device using the gate signal line driving circuit. In particular, the present invention relates to a bidirectional driving that selects a normal sequence or an inverse sequence in response to an input clock signal and scans a gate signal line.

2. Description of the Related Art

In the related art, by enabling a gate signal driving circuit to scan a gate signal in any one of two directions, image display with a high degree of functionality, such as changing the direction of a displayed image, is made possible in a display device such as a liquid crystal display.

A technology of driving a shift register circuit, which is mounted in agate line driving circuit that scans gate signal lines, in both directions is disclosed in JP2009-134845A and JP2001-506044A. The shift register circuit disclosed in JP2009-134845A controls the shift direction in response to three or more clock signals having different phases and a setting signal for determining the shift direction. There is a problem in that a plurality of switching elements that control the shift direction are disposed, the setting signal for determining the shift direction is implemented by DC voltage, and the DC voltage is applied to the switch of a specific switching element disposed in the circuit, such that the elements are deteriorated and the characteristics of the shift register circuit are deteriorated.

On the other hand, since the shift register circuit disclosed in JP2001-506044A controls the shift direction, using the phases of clock signals, the elements are suppressed from being deteriorated by DC stress, unlike the shift register circuit disclosed in JP2009-134845A.

SUMMARY OF THE INVENTION

For example, in a predetermined stage n of the shift register circuit disclosed in JP2001-50604° A., the first output transistor 16 that outputs an output pulse $OUT_n$ is turned off and the second output transistor 17 that maintains an output signal at a low voltage is turned on, by any one of the fourth-stage (n+2) output pulse $OUT_{n+2}$ or the fifth-stage (n−2) output pulse $OUT_{n-2}$ (reset state). The second output transistor 17 is kept turned on only by a condenser until it outputs the next output pulse $OUT_n$ after outputting the output pulse $OUT_n$. When the output pulse of another stage is used in resetting of a predetermined stage n, output pulses of two stages are necessary for bidirectional shift.

When the shift register circuit that can perform bidirectional scanning has a plurality of basic circuits, which output predetermined gate signals, respectively, and controls the shift direction according to the phases of the clock signals, the following problem is caused when the basic circuits are reset by the gate signal of another basic circuit. Two gate signals are necessary for resetting in the normal direction and the inverse direction, respectively. For resetting by the two gate signals, it is required to provide each basic circuit with two circuits for resetting in response to corresponding gate signals, thereby increasing the circuits. Further, when resetting is performed only by the two gate signals, the gate signals are not stable and cannot be maintained at a low voltage in the period of low voltage, which causes noises in the shift register circuit.

In consideration of the problems, the present invention provides a gate signal line driving circuit that suppresses an increase in size of a circuit and noises in gate signals, and a display device using the gate signal line driving circuit.

(1) In order to solve the problems, agate signal line driving circuit according to an aspect of the invention includes: 2n clock signal lines (n is a natural number of 2 or more) where 2n-phase clock signals, which have different phases at a predetermined cycle and sequentially become at a high voltage, are input in the normal order of the sequence in normal-directional scanning and in the inverse order of the sequence in inverse-directional scanning, respectively; and a plurality of basic circuits, each being connected with at least some of the 2n clock signal lines and outputting a gate signal, which becomes at a high voltage at a signal-high period and becomes at a low voltage at a signal-low period that is a period other than the signal-high period, from an output terminal, in which each of the basic circuits includes: a high-voltage applying switching circuit where one clock signal line out of the 2n clock signal lines is connected to an input side and applies a voltage applied to the clock signal line to the output terminal at on-state, and an off-signal applying switching circuit that applies an off-voltage to a switch of the high-voltage applying switching circuit, and a clock signal line where a clock signal having an inverse phase of the clock signal input to the clock signal line is input is connected to a switch of the off-signal applying switching circuit.

(2) In the gate signal line driving circuit of (1), the 2n clock signal lines are connected to the high-voltage applying switching circuits of the plurality of basic circuits repeated in the sequence, each of the basic circuit further includes an on-signal applying circuit that applies an on-voltage to a switch of the high-voltage applying switching circuit, and in the on-signal applying circuit of each of the basic circuits, where the gate signal of one basic circuit of first to n−1-th basic circuits backing in the inverse order of the sequence from the basic circuit and the gate signal of one basic circuit of first to n−1-th basic circuits preceding in the normal order of the sequence from the basic circuit may be input, to become turned on at a timing where one of the two gate signals becomes at a high voltage.

(3) In the gate signal line driving circuit of (1), each of the basic circuit further includes a low-voltage applying switching circuit that applies a low voltage to the output terminal, the low-voltage applying switching circuit includes a plurality of low-voltage applying switching elements that is connected in parallel with respect to the output terminal and each applies a low voltage to the output terminal, and one of the other block signal lines that are not the clock signal line connected to the high-voltage applying switching circuit may be connected to a switch of the low-voltage applying switching element.

(4) In the gate signal line driving circuit of (2), each of the basic circuit further includes a low-voltage applying switching circuit that applies a low voltage to the output terminal, the low-voltage applying switching circuit includes a plurality of low-voltage applying switching elements that is connected in parallel with respect to the output terminal and each applies a low voltage to the output terminal, and a control signal that becomes at an on-voltage in accordance with the signal-low period and becomes at an off-voltage in accordance with the timing where one of the gate signals becomes at a high voltage may be applied to a switch of one low-voltage applying switching element.

(5) In the gate signal line driving circuit of (4), the control signals may become at an off-voltage by the gate signal of one basic circuit of first to n−1-th basic circuits backing in the inverse order of the sequence from the basic circuit and the gate signal of one basic circuit of first to n−1-th basic circuits preceding in the normal order of the sequence from the basic circuit.

(6) In the gate signal line driving circuit of (4) or (5), each of the basic circuit further includes a second off-signal applying switching circuit that is connected in parallel with the off-signal applying switching circuit with respect to the switch of the high-voltage applying switching circuit, and the control signal may be applied to the switch of the second off-signal applying switching circuit.

(7) A gate signal line driving circuit according to another aspect of the invention includes: four clock signal lines where 4-phase clock signals, which have different phases at a predetermined cycle and sequentially become at a high voltage, are input in the normal order of the sequence in normal-directional scanning and in the inverse order of the sequence in inverse-directional scanning, respectively; and a plurality of basic circuits, each being connected with the four clock signal lines and outputting a gate signal, which becomes at a high voltage at a signal-high period and becomes at a low voltage at a signal-low period that is a period other than the signal-high period, from an output terminal, in which each of the basic circuits includes: a high-voltage applying switching circuit where one of clock signal line out of the four clock signal lines is connected to an input side and applies a voltage applied to the clock signal line to the output terminal at on-state, and an off-signal applying switching circuit that applies an off-voltage to a switch of the high-voltage applying switching circuit at on-state, and a clock signal line where a clock signal having an inverse phase of the clock signal input to the clock signal line is input is connected to a switch of the off-signal applying switching circuit.

(8) In the gate signal line driving circuit of (7), the four clock signal lines are connected to the high-voltage applying switching circuits of the plurality of basic circuits repeated in the sequence in accordance with the normal order, each of the basic circuit further includes an on-signal applying circuit that applies an on-voltage to a switch of the high-voltage applying switching circuit, and in the on-signal applying circuit of each of the basic circuits, where the gate signal of a basic circuit at a former stage of the basic circuit and the gate signal of a basic circuit at a later stage of the basic circuit are input, to become turned on at a timing where one of the two gate signal becomes at a high voltage.

(9) In the gate signal line driving circuit of (7), each of the basic circuit further includes a low-voltage applying switching circuit that applies a low voltage to the output terminal, the low-voltage applying switching circuit includes three low-voltage applying switching elements that are connected in parallel with respect to the output terminal and each applies a low voltage to the output terminal, and one of the other block signal lines that are not the clock signal line connected to the high-voltage applying switching circuit may be connected to a switch of the low-voltage applying circuit element.

(10) In the gate signal line driving circuit of (8), each of the basic circuit further includes a low-voltage applying switching circuit that applies a low voltage to the output terminal, the low-voltage applying switching circuit includes a plurality of low-voltage applying switching elements that is connected in parallel with respect to the output terminal and each applies a low voltage to the output terminal, and a control signal that becomes at an on-voltage in accordance with the signal-low period and becomes at an off-voltage in accordance with the timing where one of the gate signals becomes at a high voltage may be applied to a switch of one low-voltage applying switching element.

(11) In the gate signal line driving circuit of (10), the control signal may become at an off-voltage by one of the gate signal of the basic circuit at the former stage of the basic circuit and the gate signal of the basic circuit at the later stage of the basic circuit, in the on-signal applying circuit of each of the basic circuit.

(12) In the gate signal line driving circuit of (10) or (11), each of the basic circuit further includes a second off-signal applying switching circuit that is connected in parallel with the off-signal applying switching circuit with respect to the switch of the high-voltage applying switching circuit, and the control signal may be applied to the switch of the second off-signal applying switching circuit.

(13) In the gate signal line driving circuit of (10) or (11), each of the basic circuit further includes a second off-signal applying switching circuit that is connected in parallel with the off-signal applying switching circuit with respect to the switch of the high-voltage applying switch circuit and that includes first and second switching elements, and the control signal of the basic circuit at the former stage of the basic circuit is applied to a switch of the first switching element and the control signal of the basic circuit at the later stage of the basic circuit may be applied to a switch of the second switching element.

(14) In the gate signal line driving circuit of (10) or (11), each of the basic circuits may further include a charge pump circuit that is connected with another clock signal that is not the clock signal line connected to the high-voltage applying switching circuit and increases the voltage of the control signal.

(15) A display device according to still another aspect of the invention may be a display device including the gate signal line driving circuit of any one of (1) to (14).

According to the aspects of the invention, a gate signal line driving circuit that suppresses an increase in size of a circuit and noises in gate signals, and a display device using the gate signal line driving circuit are provided.

DETAILED DESCRIPTION OF THE INVENTION

First Embodiment

Figure 1:
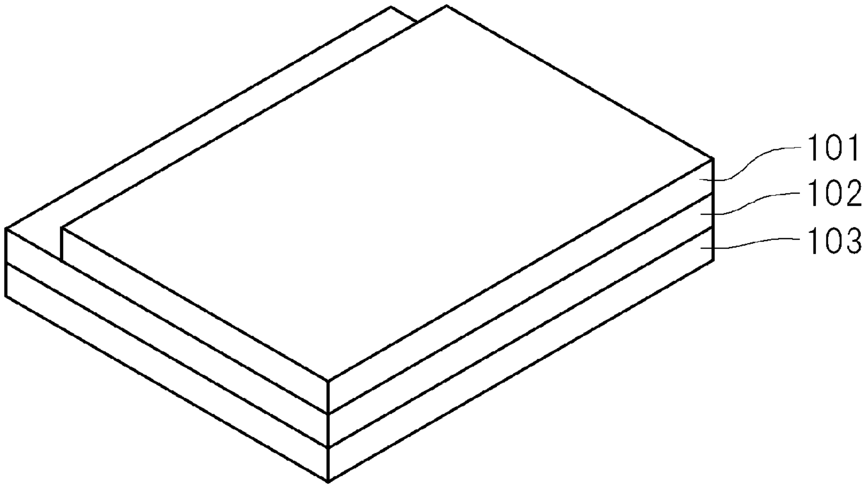
FIG. 1 is a perspective view of the entire liquid crystal display according to an embodiment of the present invention.

A display device according to a first embodiment of the present invention is, for example, an IPS (In-Plane Switching) liquid crystal display, and as shown in FIG. 1 which is a perspective view of the entire liquid crystal display, includes a TFT (Thin Film Transistor) substrate 102, a filter substrate 101 where a color filter is disposed, opposite to the TFT substrate 102, a liquid crystal material filled in the region between both of the substrates, and a backlight 103 disposed in contact with the opposite side to the filter substrate 101 of the TFT substrate 102. In this configuration, as described below, gate signal lines 105, video signal lines 107, pixel electrodes 110, common electrodes 111, and TFTs 109 are disposed on the TFT substrate 102 (see FIG. 3).

Figure 2:
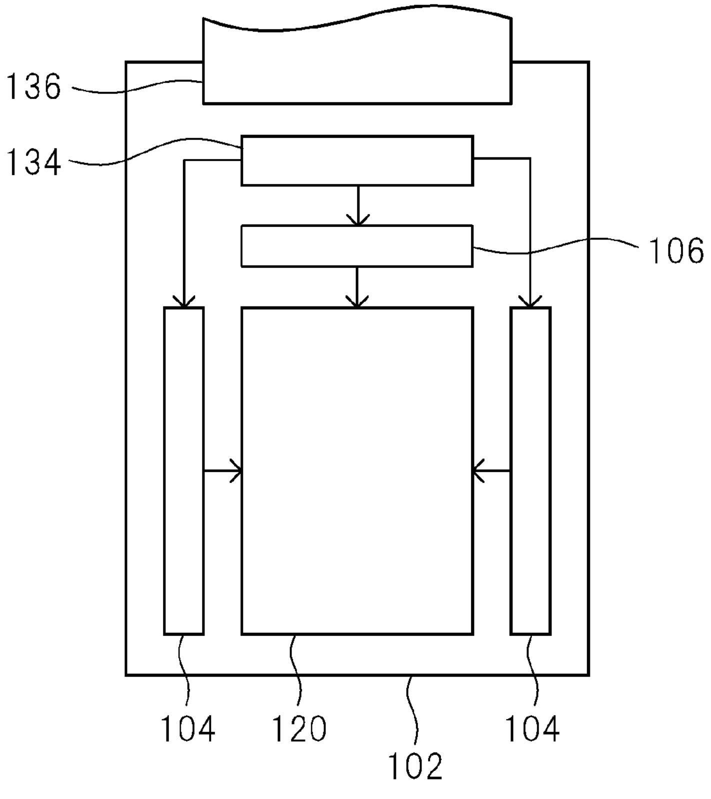
FIG. 2 is a block diagram showing the configuration of a liquid crystal display according to an embodiment of the present invention.

FIG. 2 is a block diagram showing the configuration of the liquid crystal display according to the embodiment. An FPC (Flexible Printed Circuit Board) 136 is connected to the TFT substrate 102 by press bonding and control signals are input to the TFT substrate 102 from the outside through the FPC 136.

A display unit 120, a driver IC 134, an RGB switch circuit 106, and a gate signal driving circuit 104 are disposed on the TFT substrate 102. The gate signal line driving circuit 104 is disposed at both sides of the display unit 120. The gate signal line driving circuit 104 receives control signals from the driver IC 134.

Figure 3:
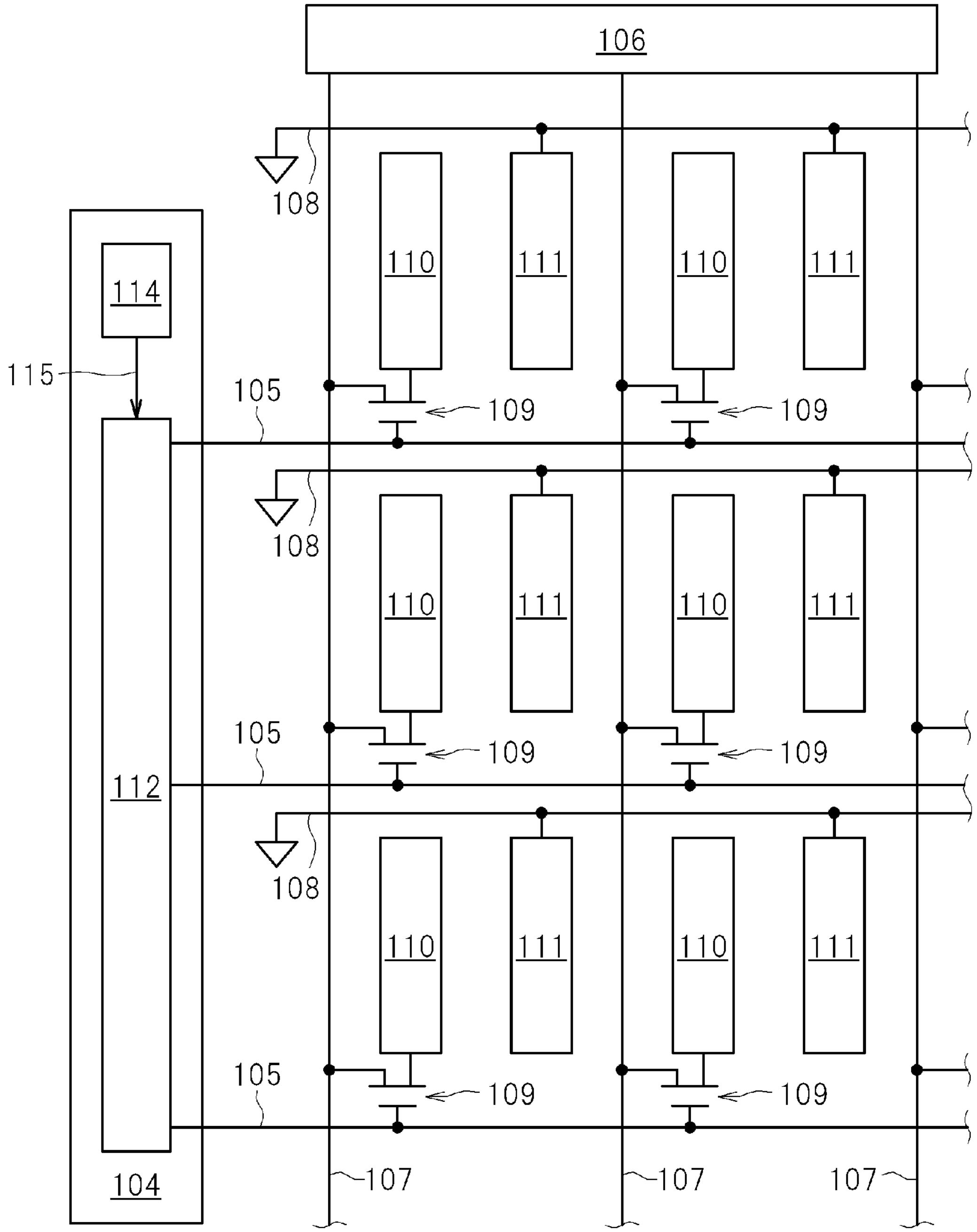
FIG. 3 is a conceptual view of an equivalent circuit of a TFT substrate according to an embodiment of the present invention.

FIG. 3 is a conceptual view of an equivalent circuit of the TFT substrate 102 according to the embodiment of the present invention. In FIG. 3, a plurality of gate lines 105 connected to the gate signal line driving circuit 104 extend at regular intervals on the TFT substrate 102, in the lateral direction in the figure.

The gate signal line driving circuit 104 is provided with a shift register control circuit 114 and a shift register circuit 112 and the shift register control circuit 114 outputs control signals 115, which are described below, to the shift register circuit 112. Further, the shift register control circuit 114 may be disposed in the driver IC 134, in which the control signals 115 are input to the gate signal line driving circuit 104 from the driver IC 134.

The shift register circuit 112 is provided with a plurality of basic circuits SR corresponding to the plurality of gate signal lines 105. For example, when there are eight hundred gate signal lines 105, the shift register 112 can be provided with eight hundred basic circuits SR. The basic circuits SR output gate signals, which are at a high voltage during corresponding gate scanning periods (signal-high periods) and at a low voltage during the other periods (signal-low periods) in one frame period, to the corresponding gate signal lines 105, by the control signal 115 input from the shift register control circuit 114.

Further, a plurality of video signal lines 107 connected to the RGB switch circuit 106 extend at regular intervals in the longitudinal direction in the figure. Further, pixel regions are defined in a grid pattern by the gate signal lines 105 and the video signal lines 107. Further, common signal lines 108 extend in parallel with the gate signal lines 105 in the lateral direction in the figure.

The TFT 109 is formed at a corner of each of the pixel regions defined by the gate signal lines 105 and the video signal lines 107 and is connected between the corresponding video signal line 107 and the pixel electrode 110. Further, a gate electrode of the TFT 109 is connected with the corresponding gate signal line 105. The common electrode 111 is formed opposite to the pixel electrode 110 in the pixel region.

In the above-mentioned circuit configuration, a reference voltage is applied to the common electrode 111 through the corresponding common signal line 108 in each of the pixel regions. Further, as a gate voltage is selectively applied to the gate of the TFT 109 through the corresponding gate signal line 105, the current flowing through the TFT 109 is controlled. A voltage of the video signal supplied to the video signal lines 107 is selectively applied to the pixel electrode 110 through the TFT 109 where the gate voltage is selectively applied to the gate. Accordingly, a difference in potential is generated between the pixel electrode 110 and the common electrode 111 and the alignment of liquid crystal molecules is controlled, such that an image is displayed with the degree of shielding light from the backlight 103 controlled.

Although the shift register circuit 112 is shown only at the left side in FIG. 3 for convenience of description, as described above, in detail, the basic circuits SR of the shift register circuit 112 are disposed at both left and right sides of the display region, and for example, when eight hundred gate signal lines 105 are disposed, the plurality of basic circuits SR disposed at both sides supply gate signals to the eight hundred gate signal lines 105. For example, the four hundred basic circuits SR at the left side supply gate signals to the odd-numbered gate signal lines 105 and the four hundred basic circuits SR at the right side supply gate signals to the even-numbered gate signal lines 105.

Figure 4:
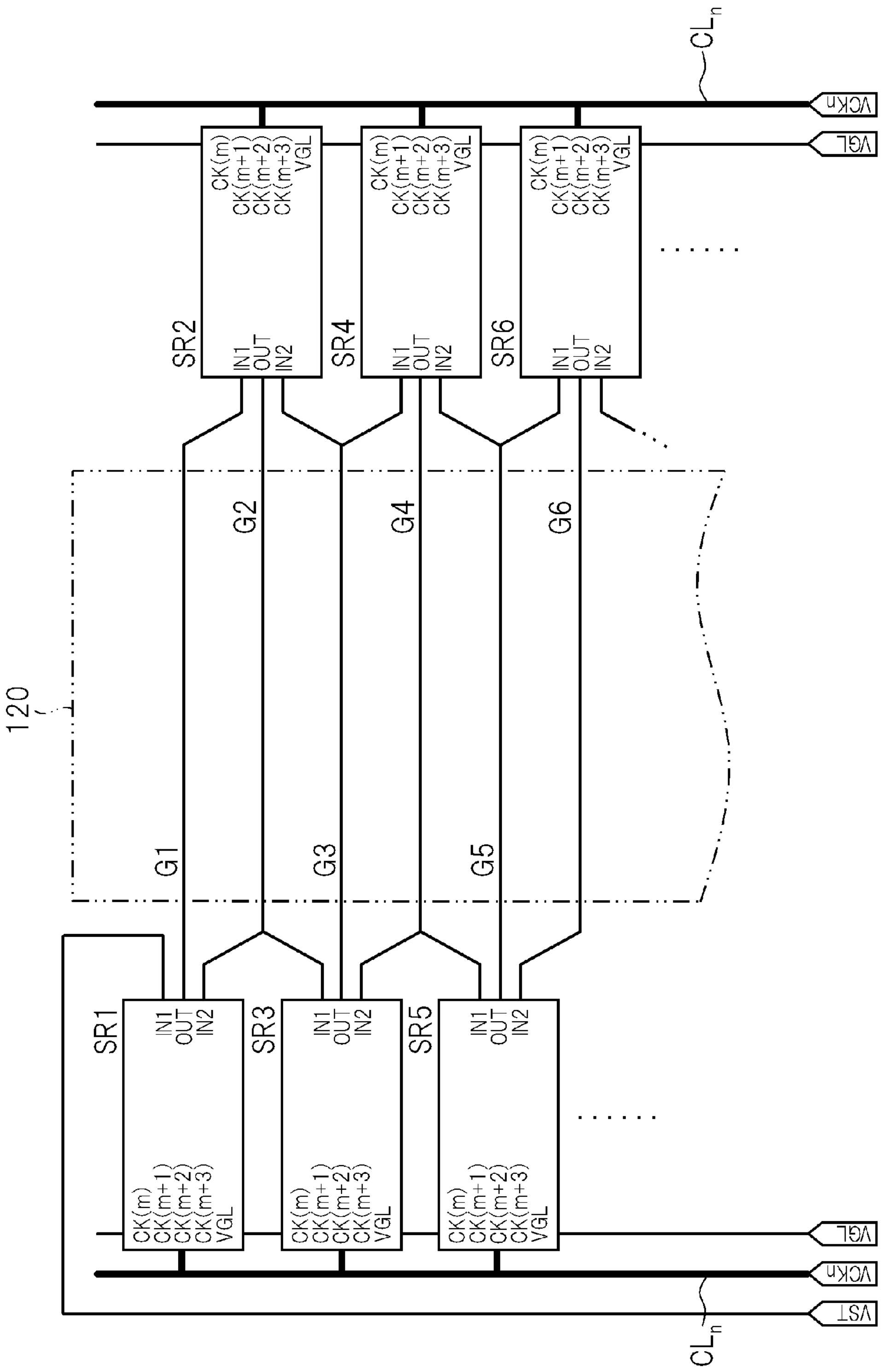
FIG. 4 is a block diagram of a shift register circuit according to a first embodiment of the present invention.

FIG. 4 is a block diagram of the shift register circuit 112 according to the embodiment. As described above, the basic circuits SR of the shift register circuit 112 are disposed at both sides of a display unit 120, in which the odd-numbered basic circuits SR are disposed at the left side in FIG. 4 while the even-numbered basic circuits SR are disposed at the right side in FIG. 4. Each of the basic circuits SR outputs a gate signal to the display unit 120. The control signals 115 input to the shift register circuit 112 are 4-phase clock signals $VCK_n$, a low-voltage line $V_{GL}$, and a sub-signal $V_{ST}$.

An n-phase clock signal $VCK_n$ is generally described herein. The n-phase clock signals $VCK_n$ are clock signals each of which has a different phase from each other in a predetermined cycle. When the n-phase clock signals $VCK_n$ have a cycle T, one cycle T can be divided into T/n periods. When T/n period is defined as one clock, one period T is composed of n clocks.

The n-phase clock signals $VCK_n$ are sequentially arranged to be at a high voltage. When one clock is defined as a first clock and the clock signal at a high voltage at the first clock is the clock signal $VCK_1$. Accordingly, in one cycle T, the clock signals $VCK_1$, $VCK_2$, $VCK_3$, . . . $VCK_n$ are at high voltages at the first clock, a second clock, a third clock, . . . and an n-th clock, and the n-phase clock signals arranged in this order are considered.

The 4-phase clock signals $VCK_n$ are input to four clock signal lines $CL_n$, respectively. The four clock signal lines $CL_n$ and the low-voltage line $V_{GL}$ are connected to each of the basic circuits SR. Further, the sub-signal $V_{ST}$ is input to an input terminal IN1 of a first basic circuit SR1.

When an m-th basic circuit is designated by SR(m), a gate signal $G_m$ output from the m-th basic circuit SR(m) is input to an input terminal IN2 of an m−1-th basic circuit SR(m−1) and an input terminal IN1 of an m+1-th basic circuit SR(m+1).

Figure 5:
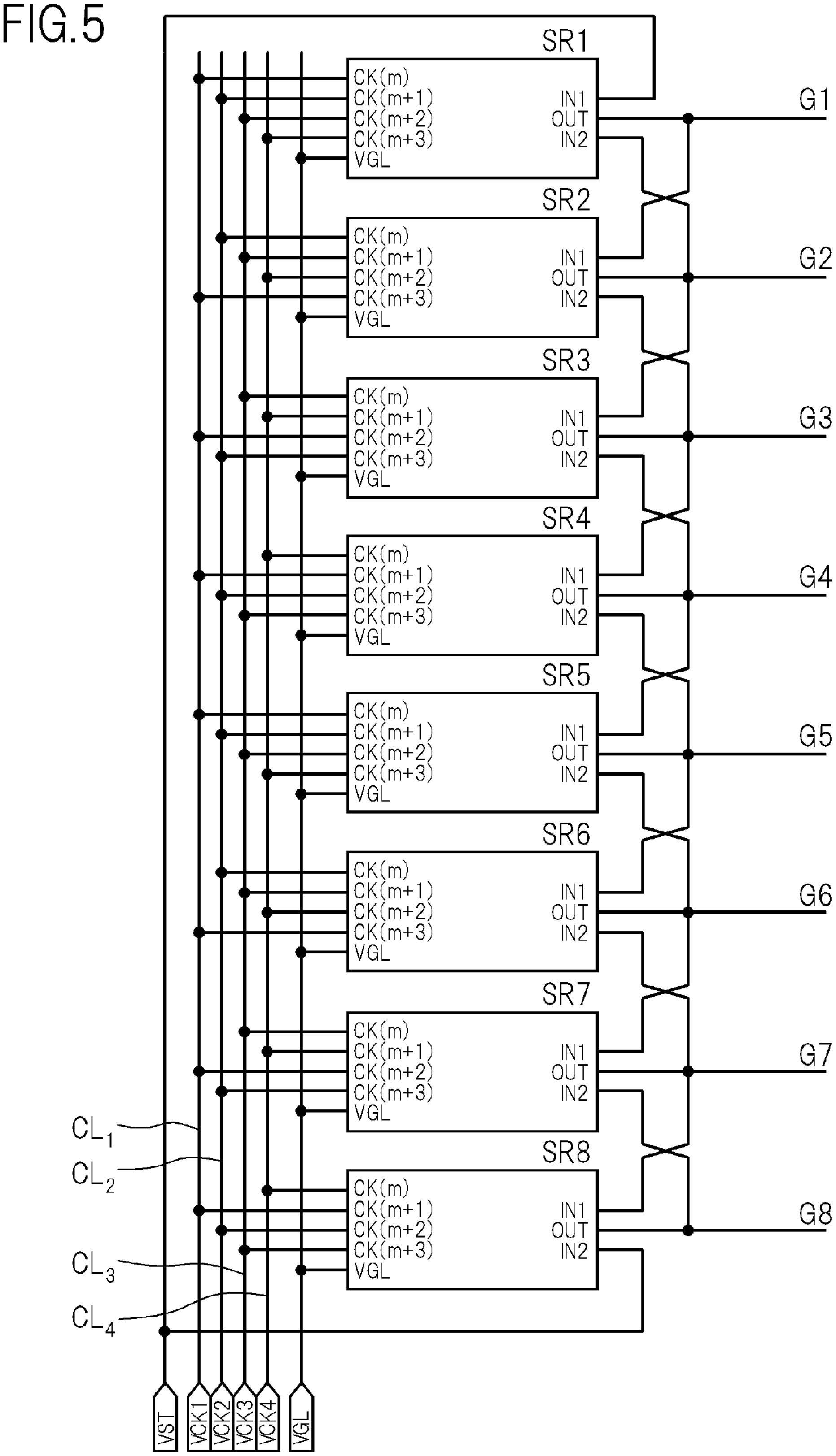
FIG. 5 is a block diagram of the shift register circuit according to the first embodiment of the present invention.

FIG. 5 is a block diagram of the shift register circuit 112 according to the embodiment and it is shown in the case the shift register circuit 112 is composed of eight basic circuits SR arranged in one line, for convenience of description.

The m-th basic circuit SR(m) is described. The gate signal $G_m$ is output from an output terminal OUT of the m-th basic circuit SR(m). A gate signal $G_{m-1}$ output from the m−1-th basic circuit SR(m−1) that is a former stage is connected to an input terminal IN1 of the m-th basic circuit SR(m) and a gate signal $G_{m+1}$ output from the m+1-th basic circuit SR(m+1) that is a later stage is connected to an input terminal IN2 of the m-th basic circuit SR(m). Further, the sub-signal $V_{ST}$ is input to the input terminal IN1 of the first basic circuit SR1 and an input terminal IN2 of an eighth basic circuit SR8.

When the remainder of m divided by 4 is k (or k=4 when evenly divided), that is, for k={(m−1) mod 4}+1, in the m-th circuit SR(m) a clock signal input from a connected clock signal line $CL_K$ out of the four clock signal lines $CL_n$ is designated by CK(m). Similarly, clock signals input from clock signal lines $CL_{k+1}$, $CL_{k+2}$, and $CL_{k+3}$ are designated by CK(m+1), CK(m+2), and CK(m+3), respectively. Further, when the value of k of $CL_k$ is an integer other than 1 to 4, it may be converted into an integer of 1 to 4 by the relationship of $CL_{k-4}=CL_k=CL_{k+4}$.

The gate signal line driving circuit 104 can perform scanning in both directions and controlled by the 4-phase clock signals $VCK_n$ input to the four clock signal lines $CL_n$ to perform normal-directional scanning or inverse-directional scanning. When normal-directional scanning is performed, the 4-phase clock signals $VCK_1$, $VCK_2$, $VCK_3$, and $VCK_4$ that sequentially become at high voltages as time passes are input sequentially in the normal order to the four clock signal lines $CL_1$, $CL_2$, $CL_3$, and $CL_4$. FIG. 5 shows when the 4-phase clock signals $VCK_n$ are input sequentially in the normal order of the clock signals to the four clock signal lines $CL_n$, that is, when normal-directional scanning is performed. When inverse scanning is performed, the 4-phase clock signals $VCK_1$, $VCK_2$, $VCK_3$, and $VCK_4$ are input sequentially in the inverse order to the four clock signal lines $CL_1$, $CL_2$, $CL_3$, and $CL_4$. That is, the clock signal $VCK_4$, clock signal $VCK_3$, clock signal $VCK_2$, and clock signal $VCK_1$ are input to the clock signal line $CL_1$, clock signal line $CL_2$, clock signal line $CL_3$, and clock signal line $CL_4$, respectively.

Figure 6:
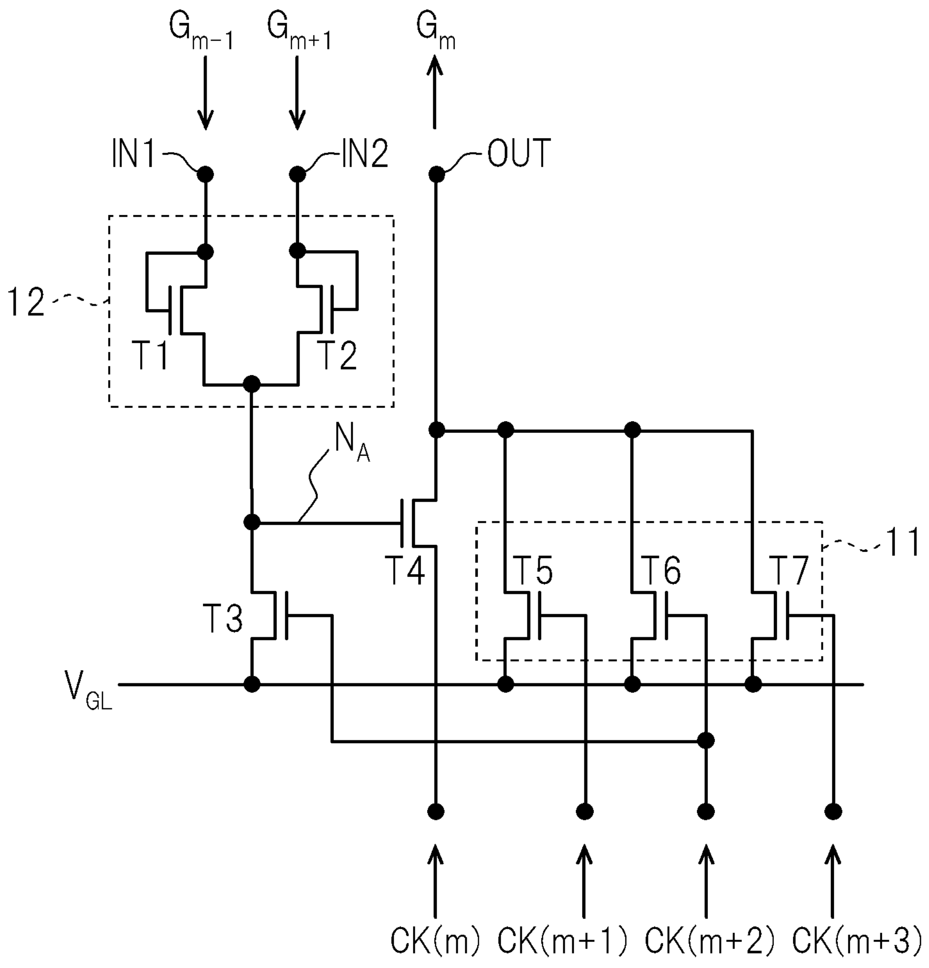
FIG. 6 is an m-th basic circuit of the shift register circuit according to the first embodiment of the present invention.

FIG. 6 is a circuit diagram of the m-th basic circuit SR(m) of the shift register circuit 112 according to the embodiment.

According to the present invention, an off-signal applying switching circuit (transistor T3) that is controlled by the clock signal CK(m+2) implements a node $N_A$ at an off-voltage. Here, the node $N_A$ is a voltage applied to a switch (gate) of a high-voltage applying switching circuit (transistor T4) and the clock signal CK(m+2) is a clock signal having an inverse phase of that of the clock signal CK(m). The clock signal CK(m) becomes at a high voltage and the output gate signal $G_m$ becomes at a high voltage, and then, the clock signal CK(m+2) becomes at a high voltage after a half cycle T/2 of the clock signal, that is, after two clocks, in either case the gate signal line driving circuit 104 performs normal-directional scanning or inverse-directional scanning. Therefore, it is possible to control the off-signal applying switching circuit by the clock signal CK(m+2) even though any-directional scanning is performed.

The high-voltage applying switching circuit that applies a voltage of a clock signal applied to a connected clock signal line to the output terminal OUT is the transistor T4 and the voltage applied to the switch (gate) of the high-voltage applying switching circuit (transistor T4) is the node $N_A$. When the node $N_A$ is at a high voltage, the transistor T4 is at on-state. Since the clock signal CK(m) is input to an input side of the transistor T4, the transistor T4 that is at on-state applies a voltage of the clock signal CK(m) to the output terminal OUT.

The off-signal applying switching circuit that applies a low voltage that is an off-voltage to the node $N_A$ is the transistor T3 and the clock signal CK(m+2) is input to a gate of the transistor T3. An input side of the transistor T3 is connected with the low-voltage line $V_{GL}$, such that when the clock signal CK(m+2) becomes at a high voltage, the transistor T3 is turned on and then the transistor T3 at on-state applies a low voltage of the low-voltage line $V_{GL}$ to the node $N_A$.

An on-signal applying circuit 12 that applies a high voltage that is an on-voltage to the node $N_A$ is two transistors T1 and T2 connected in parallel with respect to the node $N_A$. The transistors T1 and T2 are diode-connected, such that the transistors T1 and T2 respectively apply a high voltage to the node $N_A$ when gate signals $G_{m-1}$ and $G_{m+1}$ input to the transistors T1 and T2 respectively become at a high voltage.

A low-voltage applying switching circuit 11 that applies a low voltage to the output terminal OUT is three low-voltage applying switching elements (transistors T5, T6, and T7) connected in parallel with respect to the output terminal OUT. The clock signals CK(m+1), CK(m+2), and CK(m+3) are input to gates of the transistors T5, T6, and T7, respectively. That is, one of the clock signals other than the clock signals CK(m) is input to the three transistors T5, T6, and T7, respectively. The low-voltage line $V_{GL}$ is connected to input sides of the transistors T5, T6, and T7, and when the clock signals CK(m+1), CK(m+2), and CK(m+3) become a high voltage, the transistors T5, T6, and T7 are turned on and the transistors T5, T6, and T7 at on-state apply a low voltage of the low-voltage line $V_{GL}$ to the output terminal OUT.

Figure 7:
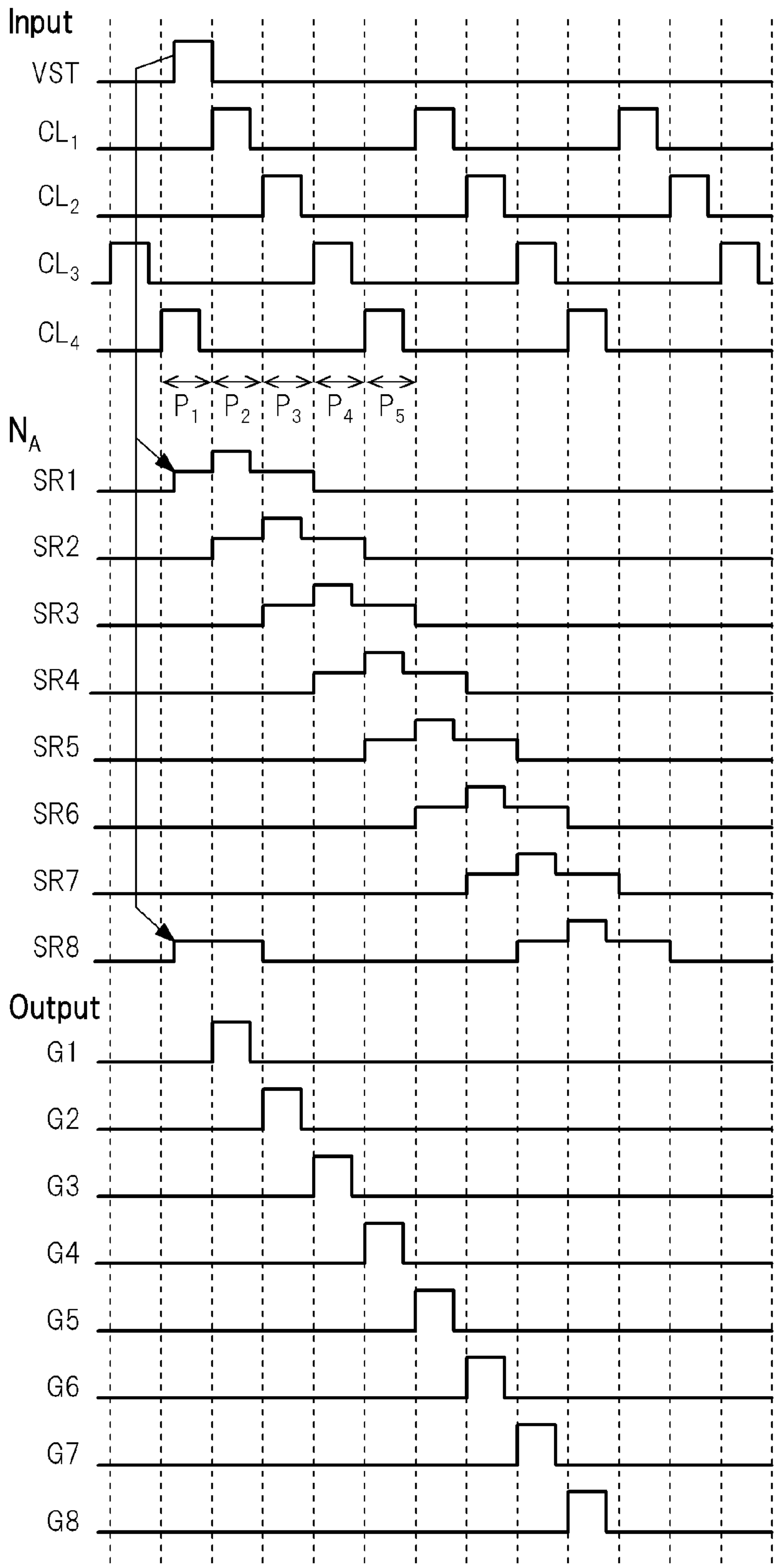
FIG. 7 is a view showing driving when the shift register circuit according to the first embodiment of the present invention performs normal-directional scanning.

FIG. 7 is a view showing when the shift register circuit 112 according to the embodiment performs normal-directional scanning. FIG. 7 shows the input signals input to the basic circuits SR, nodes $N_A$ of the basic circuits SR, and the gate signals $G_m$ that is the output signals from the basic circuits SR with lapse of time in normal-directional scanning. The periods (clocks) indicated by arrows are $P_1$, $P_2$, $P_3$, $P_4$, and $P_5$.

The input signals are the sub-signal $V_{ST}$ and the four-phase clock signals $VCK_n$. As described above, the sub-signal $V_{ST}$ is input to the input terminal IN1 of the first basic circuit SR1 and the input terminal IN2 of the eighth basic circuit SR8. Further, voltages applied to the four clock signal lines $CL_n$ are shown in FIG. 7.

FIG. 7 shows when normal-directional scanning is performed, in which the four-phase clock signals $VCK_n$ are input sequentially in the normal order with the four phases to the four clock signal lines $CL_n$, respectively. For example, the clock signal line $CL_1$ becomes at a high voltage at period $P_2$, the clock signal line $CL_2$ becomes at a high voltage at the period $P_3$, the clock signal line $CL_3$ becomes at a high voltage at the period $P_4$, and the clock signal line $CL_4$ becomes at a high voltage at the period $P_5$, and this is repeated after the period $P_5$ passes.

In the four-phase clock signals input to the m-th basic circuit SR(m), as described above, the clock signal CK(m) is the clock signal input from the clock signal line $CL_k$, the clock signal CK(m+1) is the clock signal input from the clock signal line $CL_{k+1}$, the clock signal CK(m+2) is the clock signal input from the clock signal line $CL_{k+2}$, and the clock signal CK(m+3) is the clock signal input from the clock signal line $CL_{k+3}$. Herein, as described above, k={(m−1) mod 4}+1, $CL_{k-4}$=$CL_k$=$CL_{k+4}$. That is, the voltage of the clock signal line $CL_2$, the voltage of the clock signal line $CL_2$, the voltage of the clock signal line $CL_2$, and the voltage of the clock signal line $CL_4$ show the clock signals CK(m) of the first and fifth basic circuits SR, the lock signals CK(m) of the second and sixth basic circuits SR, the clock signals CK(m) of the third to seventh basic circuits SR, and the clock signals CK(m) of the fourth and eighth basic circuits SR, respectively.

The clock signal lines $CL_n$ connected to the input sides of the high-voltage applying switching circuits (transistors T4) of eight basic circuits SR are described herein. In general, the clock signal input to the transistor T4 of the m-th basic circuit SR(m) is the clock signal CK(m) and the clock signal line where the clock signal CK(m) is input is the clock signal line $CL_k$. That is, the clock signal lines connected to the input sides of the transistors T4 of the eight basic circuits SR from the first to the eighth are sequentially the clock signal lines $CL_1$, $CL_2$, $CL_3$, $CL_4$, $CL_1$, $CL_2$, $CL_3$, and $CL_4$. There are the clocks signals $VCK_1$, $VCK_2$, $VCK_3$, and $VCK_4$ and the four clock signals $VCK_n$ that sequentially become a high voltage while there are the four clock signal lines $CL_n$, which are the clock signal lines $CL_1$, $CL_2$, $CL_3$, and $CL_4$, where the clock signals are input sequentially in the normal order (in accordance with the order) in normal-directional scanning. The four clock signal lines $CL_n$ are connected sequentially in accordance with the normal order to the high-voltage applying switching circuits of the eight basic circuits SR and it is possible to give numbers from first to eighth to the eight basic circuits SR. Once the numbers are given, the basic circuit SR at a former stage in the m-th basic circuit SR(m) indicates the m−1-th basic circuit SR(m−1) smaller by one and the basic circuit SR at a later stage indicates the m+1-th basic circuit SR(m+1) larger by one.

The operation of the eight basic circuits when normal-directional scanning is performed with time changes of the signals of FIG. 7 is described hereafter.

In the periods before the period $P_1$, the nodes $N_A$ of the eight basic circuits SR are maintained at a low voltage. That is, the nodes $N_A$ of the eight basic circuits SR are at a low voltage at the time when the period $P_1$ starts.

The clock signal line $CL_4$ is at a high voltage and the other signal lines $CL_n$ are at a low voltage in the period $P_1$. Further, the sub-signal $V_{ST}$ changes from a low voltage to a high voltage at a certain time in the period $P_1$. At this time, the input terminal IN1 of the first basic circuit SR1 and the input terminal IN2 of the eighth basic circuit SR8 change from a low voltage to a high voltage. In the first basic circuit SR1, the transistor T1 is turned on, and the transistor T1 at on-state applies a high voltage to the node $N_A$. Similarly, in the eighth basic circuit SR8, the transistor T2 is turned on and the transistor T2 at on-state applies a high voltage to the node $N_A$. Accordingly, in FIG. 7, the nodes $N_A$ of the first basic circuit SR1 and the eighth basic circuit SR8 both change from a low voltage to a high voltage at this time.

In the period $P_1$, the clock signal $VCK_4$ input to the clock signal line $CL_4$ is at a high voltage and the corresponding clock signal is the clock signal CK(m+3) in the first basic circuit SR1 and the clock signal CK(m) in the eighth basic circuit SR8. That is, in the period $P_1$, in the first basic circuit $SR_1$ the transistor T7 is turned on and the transistor T7 at on-state applies a low voltage of the low-voltage line $V_{GL}$ to the output terminal OUT. Further, in the period $P_1$, in the eighth basic circuit $SR_8$ the clock signal CK(m) input to the transistor T4 is at a high voltage. However, at the time when the period $P_1$ starts, the node $N_A$ is at a low voltage and the transistor T4 is at off-state, and the transistor T4 at off-state does not apply a high voltage of the clock signal CK(m) to the output terminal OUT. Thereafter, the node $N_A$ changes from a low voltage to a high voltage at the time in the period $P_1$. At this time, the input side of the transistor T4 is at a high voltage of the clock signal CK(m) and a predetermined time is taken until the transistor T4 is turned on even if the gate of the transistor T4 changes from a low voltage to a high voltage, such that the transistor T4 does not sufficiently apply a high voltage of the clock signal CK(m) to the output terminal OUT. Accordingly, the gate signals $G_m$ output from the eight basic circuits SR are all at a low voltage in the period $P_1$.

In the period $P_2$, the clock signal $VCK_1$ input to the clock signal line $CL_1$ is at a high voltage and the corresponding clock signal is the clock signal CK(m) in the first basic circuit SR1 and the clock signal CK(m+1) in the eighth basic circuit SR8. Further, in the period $P_2$, the sub-signal $V_{ST}$ is at a low voltage while the transistor T1 of the first basic circuit SR1 and the transistor T2 of the eighth basic circuit SR8 are both turned off. However, the nodes $N_A$ of the first basic circuit SR1 and the eighth basic circuit SR8 keep held at a high voltage.

In the first basic circuit SR1, in the period $P_2$, the clock signal CK(m) is at a high voltage and the transistor T4 at on-state applies a high voltage of the clock signal CK(m) to the output terminal OUT. Accordingly, the gate signal $G_1$ that the first basic circuit SR1 outputs from the output terminal OUT becomes at a high voltage in the period $P_2$.

Further, in the period $P_2$, the other clock signals CK(m+1), CK(m+2), and CK(m+3) are at a low voltage, the three transistors T5, T6, and T7 of the low-voltage applying switching circuit 11 are turned off, and the transistors T5, T6, and T7 at off-state do not apply a low voltage of the low-voltage line $V_{GL}$ to the output terminal OUT.

In practice, since there is a threshold voltage $V_{th}$ in the transistors T1 and T2, the node $N_A$ becomes at a voltage reduced by the threshold voltage $V_{th}$ of the transistor T1 from the voltage of the input sub-signal $V_{ST}$ in the period $P_1$. In the period $P_2$, the transistor T4 may be not sufficiently turned on at this voltage. Therefore, the transistor T4 of the basic circuit SR is formed such that parasitic capacitance C (not shown) exits between the gate and the output side of the transistor T4. In the period $P_1$, the voltage of the node $N_A$ is at a high voltage and the parasitic capacitance C is charged with the voltage. The node $N_A$ is maintained at a high voltage and the transistor T4 is at on-state at the time when the period $P_2$ starts. The clock signal CK(m) that is at a high voltage is input to the input side of the transistor T4 at on-state and the transistor T4 applies a high voltage to the output side. The node $N_A$ is increased in voltage to the voltage where the voltage of the parasitic capacitance C is added to the voltage of the output side, by capacity coupling of the parasitic capacitance C. This is called a bootstrap voltage. Therefore, the transistor T4 is sufficiently at on-state and the gate signal $G_1$ output from the output terminal OUT is increased in voltage that same as a high voltage of the input clock signal CK(m). FIG. 7 shows when the node $N_A$ of the first basic circuit SR1 is at a higher voltage in the period in which the clock signal $CL_1$ is at a high voltage, for example, in the period $P_2$. Further, the transistor T4 is preferably formed such that the parasitic capacitance between the gate and the output side is large and the parasitic capacitance between the gate and the input side is small in the transistor T4. Further, when the parasitic capacitance exists between the gate and the output side is not sufficiently large, it is preferable to dispose a capacitance between the gate and the output side.

Meanwhile, in the eighth basic circuit SR8, the clock signal CK(m) is at a low voltage and the clock signal CK(m+1) is at a high voltage in the period $P_2$. At this time, the transistor T4 at on-state applies a low voltage of the clock signal CK(m) to the output terminal OUT. Further, the clock signal CK(m+1) is at a high voltage, the transistor T5 is turned on, the transistor T5 at on-state applies a low voltage of the low-voltage line $V_{GL}$ to the output terminal OUT. That is, the two transistors T4 and T5 apply a low voltage to the output terminal OUT and the gate signal $G_8$ output from the output terminal OUT is at a low voltage.

Accordingly, in the period $P_2$, only the gate signal $G_1$ output from the first basic circuit SR1 is at a high voltage and the gate signals $G_m$ output from the other basic circuits SR are maintained at a low voltage. Further, the gate signal $G_1$ output from the first basic circuit SR1 is input to the input terminal IN1 of the second basic circuit SR2, and in the period $P_2$, the transistor T1 is turned on and the transistor T1 at on-state applies a high voltage to the node $N_A$, in the second basic circuit SR2.

In the period $P_3$, the clock signal $VCK_2$ input to the clock signal line $CL_2$ is at a high voltage and the corresponding clock signal is the clock signal CK(m+1) in the first basic circuit SR1, the clock signal CK(m) in the second basic circuit SR2, and the clock signal CK(m+2) in the eighth basic circuit SR8.

In the second basic circuit SR2, in the period $P_2$, the gate signal $G_1$ input to the input terminal IN1 is at a high voltage, the transistor T1 is turned on, and the transistor T1 at on-state applies a high voltage to the node $N_A$. When the node $N_A$ is at a high voltage, the transistor T4 is at on-state. Accordingly, similarly to the operation of the first basic circuit SR1 in the period $P_2$, in the second basic circuit SR2, in the period $P_3$, the transistor T4 at on-state applies a high voltage of the clock signal CK(m) to the output terminal OUT and the gate signal $G_2$ that the second basic circuit SR2 outputs from the output terminal OUT is at a high voltage in the period $P_3$. Similarly, in the second basic circuit SR2, in the period $P_3$, the other clock signals CK(m+1), CK(m+2), and CK(m+3) are at low voltages, the three transistors T5, T6, and T7 of the low-voltage applying switching circuit 11 are at off-state, and the transistors T5, T6, and T7 at off-state do not apply a low voltage of the low-voltage line $V_{GL}$ to the output terminal OUT.

In the first basic circuit SR1, in the period $P_3$, the gate signal $G_2$ input to the input terminal IN2 is at a high voltage, the transistor T2 is turned on, the transistor T2 at on-state applies a high voltage to the node $N_A$, and the node $N_A$ is maintained at a high voltage. Although the node $N_A$ is maintained at a high voltage and the transistor T4 keeps at on-state, the clock signal CK(m) input to the transistor T4 is at a low voltage in the period $P_3$ and the transistor T4 at on-state applies a low voltage of the clock signal CK(m) to the output terminal OUT. Further, in the first basic circuit SR1, in the period $P_3$, the clock signal CK(m+1) is at a high voltage, the transistor T5 is turned on, the transistor T5 at on-state applies a low voltage of the low-voltage line $V_{GL}$ to the output terminal OUT. That is, the first basic circuit SR1 outputs the gate signal $G_1$ that is at a high voltage in the period $P_2$. Further, in the period $P_3$, even though the gate signal $G_2$ input to the input terminal IN2 is at a high voltage, the gate signal $G_1$ is at a low voltage in the period $P_3$. Therefore, the first basic circuit SR1 outputs the gate signal $G_1$ with the period $P_2$ as a signal-high period and the other periods as a signal-low period to the output terminal OUT.

In the period $P_4$, the clock signal $VCK_3$ input to the clock signal line $CL_3$ is at a high voltage, and in the first basic circuit SR1, the corresponding clock signal is the clock signal CK(m+2). As described above, the clock signal $VCK_3$ is a clock signal having an inverse phase of that of the clock signal $VCK_1$, that is, the clock signal CK(m+2) is a clock signal having an inverse phase of that of the clock signal CK(m).

In the first basic circuit SR1, the clock signal CK(m+2) applied to the gate of the transistor T3 that is the off-signal applying switching circuit changes from a low voltage to a high voltage at the time when the period $P_4$ starts, the transistor T3 is turned on, and the transistor T3 at on-state applies a low voltage to the node $N_A$. As a result, the node $N_A$ changes from a high voltage to a low voltage at the time when the period $P_4$ starts. When the node $N_A$ is at a high voltage, the transistor T4 is turned off. FIG. 7 shows when the node $N_A$ of the first basic circuit SR1 changes from a high voltage to a low voltage at the time when the period $P_4$ starts. Note, similarly, that in the eighth basic circuit SR8, since the clock signal CK(m+2) changes from a low voltage to a high voltage when the period $P_3$ starts, the node $N_A$ changes from a high voltage to a low voltage at the time when the period $P_3$ starts.

Further, in the first basic circuit SR1, in the period $P_4$, the transistor T6 where the clock signal CK(m+2) is input is turned on, the transistor T6 at on-state applies a low voltage to the output terminal OUT.

Similarly, in the first basic circuit SR1, in the period $P_5$, the transistor T7 where the clock signal CK(m+3) is input is turned on, the transistor T7 at on-state applies a low voltage to the output terminal OUT.

Further, even if the period P5 has passed, the 4-phase clock signals CK(m), CK(m+1), CK(m+2), and CK(m+3) repeatedly become at a high voltage sequentially in the normal order. When the clock signal CK(m+1) is at a high voltage, the transistor T5 is turned on, the transistor T5 at on-state applies a low voltage to the output terminal OUT. When the clock signal CK(m+2) is at a high voltage, the transistor T6 is turned on, the transistor T6 at on-state applies a low voltage to the output terminal OUT. When the clock signal CK(m+3) is at a high voltage, the transistor T7 is turned on, the transistor T7 at on-state applies a low voltage to the output terminal OUT. The gate signal $G_1$ is stably maintained at a low voltage in the signal-low period by repeating this process.

Further, when the clock signal CK(m+2) is at a high voltage, the transistor T3 is turned on, the transistor T3 at on-state applies a low voltage to the node $N_A$. The node $N_A$ is connected to the low-voltage line $V_{GL}$ every time the clock signal CK(m+2) becomes at a high voltage, such that in accordance with the signal-low period, the node $N_A$ is stably maintained at a low voltage and the transistor T4 stably keeps at off-state. As a result, the transistor T4 is suppressed from applying a high voltage of the clock signal CK(m) to the output terminal OUT in the signal-low period, such that noises in the gate signal $G_m$ are reduced in the signal-low period.

For example, a case similar to the shift register circuit disclosed in JP2001-506044A as described herein, is considered to compare with the basic circuit SR shown in FIG. 6. In the case, in the m-th basic circuit SR(m), the transistor T3 that is an off-signal applying switching circuit is turned on by the gate signal $G_{m-2}$ output from the m−2-th basic circuit SR(m−2) and the gate signal $G_{m+2}$ output from the m+2-th basic circuit SR(m+2) and when the transistor T3 at on-state applies a low voltage to the node $N_A$ is. In this case, since the gate signal $G_m$ becomes at a high voltage only in one period (clock) in one frame period in general and the transistor T3 has to be on-state through the signal-low period, a retention capacitance is required. The retention capacitance is charged with a high voltage when the two gate signals $G_{m-2}$ and $G_{m+2}$ becomes at a high voltage. The high voltage kept at the retention capacitance is applied to the gate of the transistor T3 and the transistor T3 keeps at on-state. However, as time passes, when the voltage kept at the retention capacitance decreases, the transistor T3 does not keep stably at on-state, and accordingly, the node $N_A$ is not sufficiently maintained at a low voltage. As a result, noises in the gate signal $G_m$ in the signal-low period increase.

Further, two switching elements are necessary to turn on the transistor T3 by the two gate signals $G_{m-2}$ and $G_{m+2}$, by turning on the transistor T3 with the two gate signals $G_{m-2}$ and $G_{m+2}$. In contrast, in the basic circuit SR shown in FIG. 6, the off-signal applying switching circuit is implemented by only one transistor T3, such that it is possible to lower the voltage of the node $N_A$ to a low voltage by using one transistor T3.

Further, a similar operation is performed in the m-th basic circuit SR(m). Although the sub-signal $V_{ST}$ is input to the input terminal IN1 of the first basic circuit SR1, in the other m-th basic circuits SR(m), the gate signal $G_{m-1}$ that the m−1-th basic circuit SR(m−1) outputs is input to the input terminal IN1. Except for this, the operation of the m-th basic circuit SR(m) is basically the same as the operation of the first substrate circuit SR1.

That is, since the gate signal $G_{m-1}$ is at a high voltage, the node $N_A$ is at a high voltage and the transistor T4 is turned on. The gate signal $G_m$ of the m-th basic circuit SR(m) becomes at a high voltage in the next period (clock). In the further next period (clock), although the gate signal $G_{m+1}$ is input, the node $N_A$ is maintained at a high voltage but the gate signal $G_m$ becomes at a low voltage. In the further next period, the node $N_A$ becomes at a low voltage by the clock signal CK(m+2) and the transistor T4 is turned off. Thereafter, the node $N_A$ is maintained at a low voltage, corresponding to the signal-low period.

This operation is performed with the value of m increasing and the gate signals $G_m$ output by the m-th basic circuits SR(m) sequentially become at high voltages, such that the gate signal line driving circuit 104 can perform normal-directional scanning.

Figure 8:
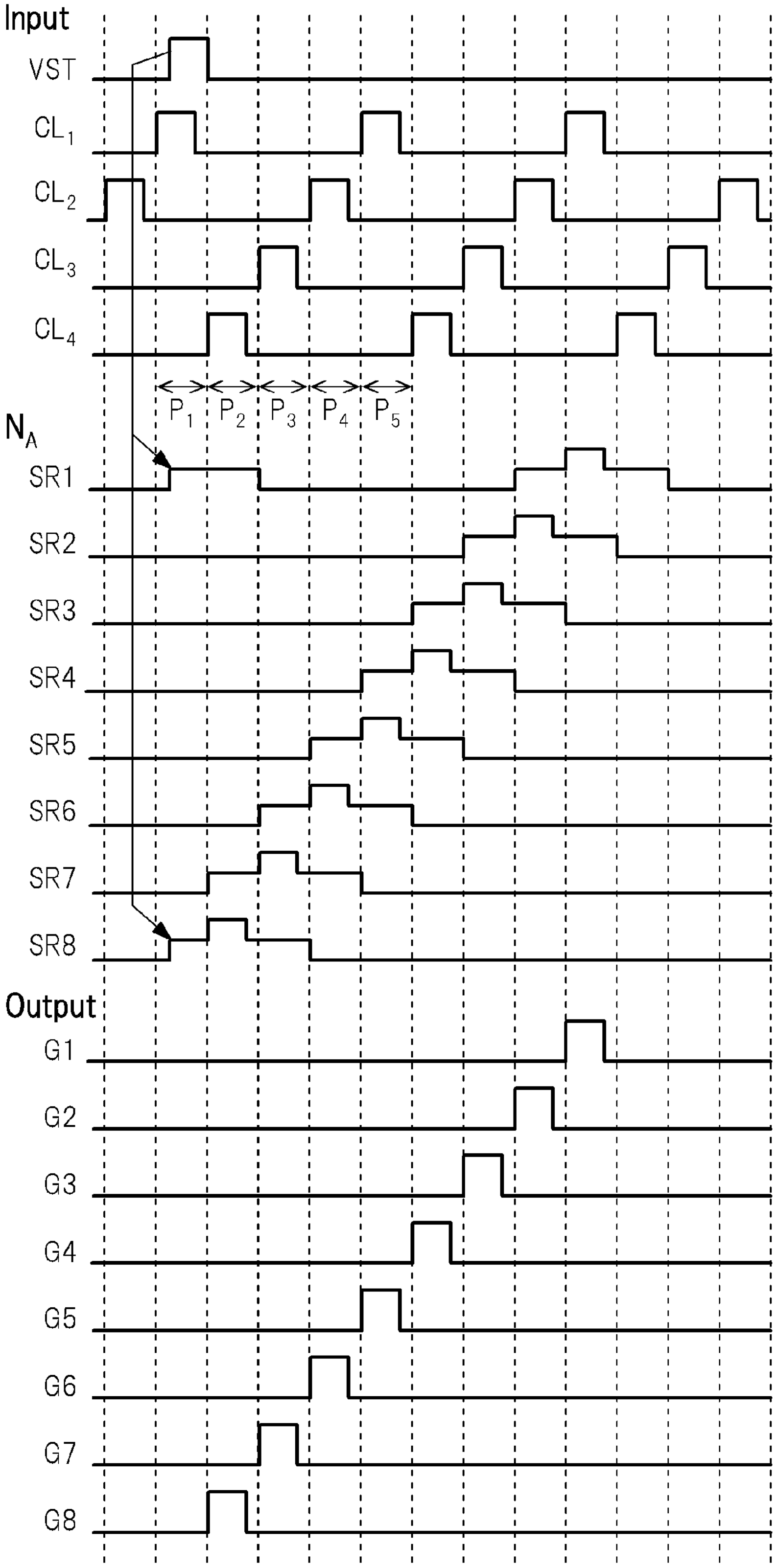
FIG. 8 is a view showing driving when the shift register circuit according to the first embodiment of the present invention performs inverse-directional scanning.

FIG. 8 is a view showing when the shift register circuit 112 according to the embodiment performs inverse-directional scanning. FIG. 8 shows the input signals input to the basic circuits SR, the nodes $N_A$ of the basic circuits SR, and the gate signals $G_m$ that are the output signals from the basic circuits SR with lapse of time in inverse-directional scanning. Similarly to FIG. 7, the periods (clocks) indicated by arrows in the figure are $P_1$, $P_2$, $P_3$, $P_4$, and $P_5$, respectively.

FIG. 8 shows inverse-directional scanning, which is different from that shown in FIG. 7 in the 4-phase clock signals VCK, input to the four clock signal lines $CL_n$. For example, the clock signal line $CL_4$ becomes at a high voltage at period $P_2$, the clock signal line $CL_3$ becomes at a high voltage at the period $P_3$, the clock signal line $CL_2$ becomes at a high voltage at the period $P_4$, and the clock signal line $CL_1$ becomes at a high voltage at the period $P_5$, and this is repeated after the period $P_5$ passes.

The operation of the eight basic circuits SR when inverse-directional scanning is performed with time changes of the signals of FIG. 8 is described hereafter.

In the periods before the period $P_1$, the nodes $N_A$ of the eight basic circuits SR are all maintained at a low voltage, similarly to those shown in FIG. 7. That is, all the nodes $N_A$ of the eight basic circuits SR are at a low voltage at the time when the period $P_1$ starts.

In the period $P_1$, the clock signal $VCK_4$ input to the clock signal line $CL_1$ is at a high voltage and the corresponding clock signal is the clock signal CK(m+3) in the eighth basic circuit SR8 and the clock signal CK(m) in the first basic circuit SR1. That is, the states of the first basic circuit SR1 and the eighth basic circuit SR8 in the case shown in FIG. 7 are basically the same as the states of the eighth basic circuit SR8 and the first basic circuit SR1 in the case shown in FIG. 8, respectively.

In the period $P_2$, the clock signal $VCK_1$ input to the clock signal line $CL_4$ is at a high voltage and the corresponding clock signal is the clock signal CK(m) in the eighth basic circuit SR8 and the clock signal CK(m+1) in the first basic circuit SR1.

Accordingly, the clock signal CK(m) is at a high voltage in the period $P_2$ and the gate signal $G_1$ that is at a high voltage in the period $P_2$ is input in the first basic circuit SR1 in the case shown in FIG. 7, while the clock signal CK(m) is at a high voltage in the period $P_2$ and the gate signal $G_8$ that is at a high voltage in the period $P_2$ is output in the eighth basic circuit SR8 in the case shown in FIG. 8. Therefore, the gate signal $G_1$ is at first output from the first basic circuit SR1 in the period $P_2$ in normal-directional scanning, whereas the gate signal $G_8$ is at first output from the eighth basic circuit SR8 in the period $P_2$ in inverse-directional scanning.

In the period $P_2$, the gate signal $G_8$ is at a high voltage, and in the seventh basic circuit SR7, the transistor T2 is turned on, and the transistor T2 at on-state applies a high voltage to the node $N_A$. In the period $P_3$, the clock signal $VCK_2$ input to the clock signal line $CL_3$ is at a high voltage, and in the seventh basic circuit SR7, the corresponding clock signal is the clock signal CK(m). In the period $P_3$, the transistor T4 at on-state applies a high voltage of the clock signal CK(m) to the output terminal OUT, and in the period $P_3$, the gate signal $G_7$ is at a high voltage, and the gate signal line driving circuit 104 can perform inverse-directional scanning hereafter, as shown in FIG. 8.

The operation when the gate signal line driving circuit 104 performs normal-directional scanning and inverse directional scanning was described above. According to the present invention, the 4-phase clock signals that become sequentially at a high voltage are input to the four clock signal lines in the normal order of the sequence, such that normal-directional scanning is input to the four clock signal lines in the inverse order of the sequence, and thus, inverse-directional scanning becomes possible.

Second Embodiment

A display device according to a second embodiment of the present invention has the same configuration in detail as the display device according to the first embodiment. The main difference from the display device according to the first embodiment is the configuration of the basic circuit SR of the shift transistor 112.

Figure 9:
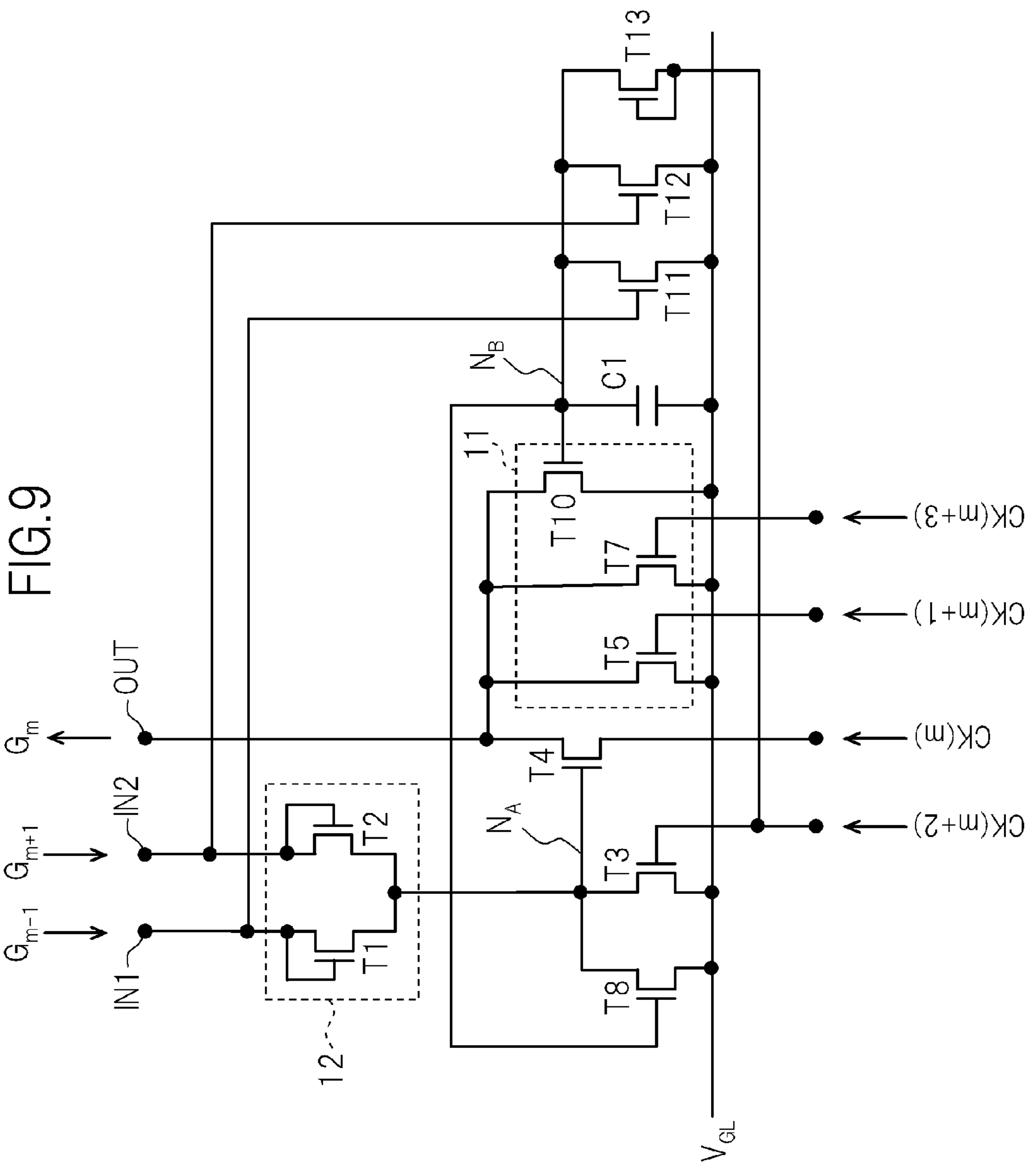
FIG. 9 is an m-th basic circuit of the shift register circuit according to a second embodiment of the present invention.

FIG. 9 is a circuit diagram of the m-th basic circuit SR(m) of the shift register circuit 112 according to the embodiment. The main difference from the m-th basic circuit SR(m) according to the first embodiment, which is shown in FIG. 6, is that the configuration of the low-voltage applying switching circuit 11 is different and a second off-signal applying switching circuit (transistor T8) is further provided.

The low-voltage applying switching circuit 11 is three low-voltage applying switching elements (transistors T5, T7, and T10) which are connected in parallel with respect to the output terminal OUT. The m-th basic circuit SR(m) according to the first embodiment which is shown in FIG. 5 is provided with the transistor T6 in which the clock signal CK(m+2) is input to the gate, while the m-th basic circuit SR(m) according to the embodiment which is shown in FIG. 9 is provided with a transistor T10 and an input side of the transistor T10 is connected to the low-voltage line $V_{GL}$. When a voltage applied to a gate of the transistor T10 is a node $N_B$, the voltage of the node $N_B$ becomes a control signal for controlling driving of the transistor T10.

The m-th basic circuit SR(m) is provided with a retention capacitance $C_1$ and three transistors T11, T12, and T13, which are connected in parallel with respect to the node $N_B$. The transistor T13 is diode-connected, and when a clock signal CK(m+2) input to the transistor T13 becomes at a high voltage, the transistor T13 applies a high voltage to the node $N_B$. That is, when the clock signal CK(m+2) becomes at a high voltage, the node $N_B$ becomes at a high voltage and the transistor T10 is turned on. The transistor T10 at on-state applies a low voltage to the output terminal OUT. The clock signal CK(m+2) is input to the gate of the transistor T10 through the transistor T13 and has the same function as the transistor T6 of the m-th basic circuit SR(m) according to the first embodiment which is shown in FIG. 6.

Gates of the two transistors T11 and T12 are connected to the input terminals IN1 and IN2. Input sides of the transistors T11 and T12 are both connected with the low-voltage line $V_{GL}$. When any one of the gate signal $G_{m-1}$ input to the input terminal IN1 and the gate signal $G_{m+1}$ input to the input terminal IN2 becomes at a high voltage, any one of the two transistors T11 and T12 is turned on and the transistor at on-state out of the two transistors T11 and 12 applies a low voltage to the node $N_B$.

The retention capacitance $C_1$ is disposed between the node $N_B$ and the low-voltage line $V_{GL}$ and charged with a high voltage when the node $N_B$ becomes at a high voltage. When the clock signal CK(m+2) is at a high voltage, the transistor T13 applies a high voltage to the node $N_B$. In this case, the retention capacitance C1 is charged with a high voltage. When the clock signal CK(m+2) is at a low voltage, although the transistor T13 is turned off, the node $N_B$ is maintained at a high voltage by the retention capacitance $C_1$ charged with a high voltage, the transistor T10 keeps at on-state, and the transistor T10 at on-state applies a low voltage to the output terminal OUT. The clock signal CK(m+2) becomes periodically at a high voltage in accordance with the signal-low period and the retention capacitance $C_1$ is charged with a high voltage every time the clock signal CK(m+2) becomes at a high voltage, such that the node $N_B$ is stably maintained at a high voltage through the signal-low period and the low-voltage applying switching circuit 11 can stably apply a low voltage of the low-voltage line $V_{GL}$ to the output terminal OUT.

Any one of the gate signal $G_{m-1}$ and the gate signal $G_{m+1}$ becomes at a high voltage in accordance with the signal-high period, any one of the two transistors T11 and T12 is turned on and the node $N_B$ that is at a high voltage is changed to a low voltage by the transistor at on-state out of the two transistors T11 and T12. When the node $N_B$ is at a low voltage, the transistor T10 is turned off.

That is, the node $N_B$ is maintained at a high voltage that is an on-voltage in accordance with the signal-low period and becomes at a low voltage that is an off-voltage in accordance with the signal-high period. The node $N_B$ changes from a high voltage to a low voltage at the timing when any one of the gate signal $G_{m-1}$ and the gate signal $G_{m+1}$ becomes at a high voltage.

The second off-signal applying switching circuit is the transistor T8 and connected with the off-signal applying switching circuit T3 in parallel with respect to the node $N_A$. The node $N_B$ is connected to a gate of the transistor T8 and an input side of the transistor T8 is connected to the low-voltage line $V_{GL}$.

As described above, the node $N_B$ is maintained at a high voltage in accordance with the signal-low period, the transistor T8 keeps at on-state, and the transistor T8 at on-state applies a low voltage to the node $N_A$, such that the node $N_A$ is stably maintained at a low voltage and the transistor T4 stably keeps at off-state, in accordance with the signal-low period. Therefore, a voltage of the clock signal CK(m) is suppressed from being applied to the output terminal OUT through the transistor T4, through the signal-low period, and the noises in the gate signal output from the gate signal line driving circuit 104 are reduced. Further, the node $N_B$ becomes at a low voltage and the transistor T8 is turned off, in accordance with the signal-high period.

Figure 10:
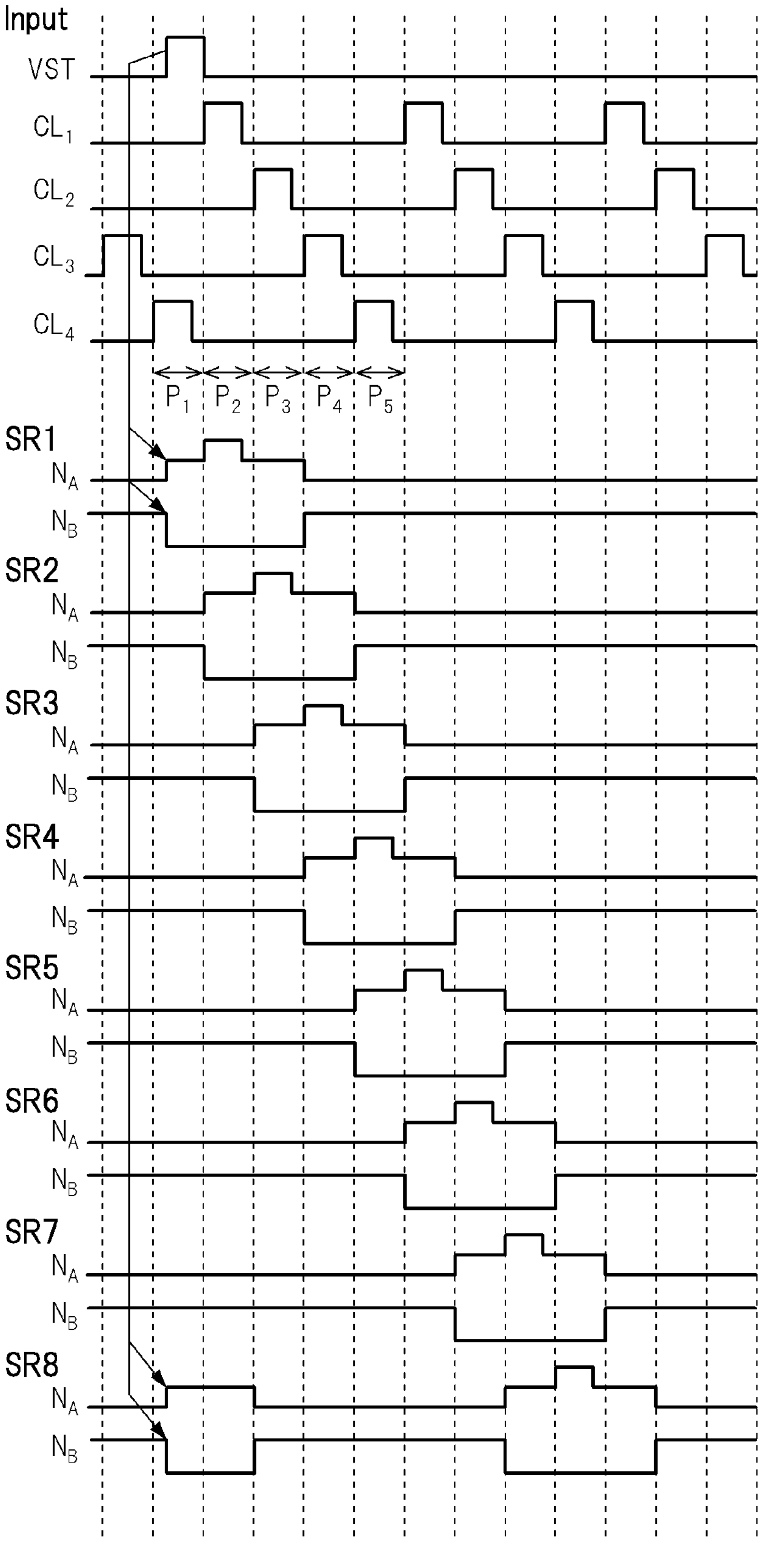
FIG. 10 is a view showing driving when the shift register circuit according to the second embodiment of the present invention performs normal-directional scanning.

FIG. 10 is a view showing when the shift register circuit 112 according to the embodiment performs normal-directional scanning. FIG. 10 shows the input signals input to the basic circuit SR, the nodes $N_A$ and nodes $N_B$ of the basic circuits SR with lapse of time in normal-directional scanning. Similarly to FIG. 7, the periods (clocks) indicated by arrows in the figure are $P_1$, $P_2$, $P_3$, $P_4$, and $P_5$, respectively. FIG. 10 shows the voltage of the node $N_B$ of the basic circuit SR, in addition to the operation of the basic circuit SR according to the first embodiment which is shown in FIG. 7.

The node $N_A$ of the basic circuit SR is maintained at a high voltage in accordance with the signal-low period. Taking the second basic circuit SR2, as an example for explanation, the gate signal $G_2$ output from the second basic circuit SR2 becomes at a high voltage at the period P3. In the second basic circuit SR2, the transistor T1 is turned on at the timing when the gate signal $G_1$ becomes at a high voltage, and then, the node $N_A$ changes from a low voltage to a high voltage at the time when the period $P_2$ starts. Further, the transistor T3 is turned on at the timing when the clock signal CK(m+2) becomes at a high voltage and the node $N_A$ changes from a high voltage to a low voltage at the time when the period $P_5$ starts. That is, in the second basic circuit SR2, the node $N_A$ is at a high voltage during the periods $P_2$, $P_3$, and $P_4$.

On the other hand, the node $N_B$ of the basic circuit SR is maintained at a high voltage in accordance with the signal-low period. In the second basic circuit SR2, the transistor T11 is turned on at the timing when the gate signal $G_1$ becomes at a high voltage, and the node $N_B$ changes from a high voltage to a low voltage at the time when the period $P_2$ starts. Further, the transistor T13 is turned on at the timing when the clock signal CK(m+2) becomes at a high voltage and the node $N_B$ changes from a low voltage to a high voltage at the time when the period $P_5$ starts. That is, in the second basic circuit SR2, the node $N_B$ is at a high voltage during the periods $P_2$, $P_3$, and $P_4$ and the node $N_B$ is at a high voltage at periods other than the periods $P_2$, $P_3$, and $P_4$.

In the m-th basic circuit SR (m) according to the embodiment, the node $N_B$ changes from a high voltage to a low voltage at the timing when the node $N_A$ changes from a low voltage to a high voltage. Similarly, the node $N_B$ changes from a high voltage to a low voltage at the timing when the node $N_A$ changes from a low voltage to a high voltage.

Third Embodiment

A display device according to a third embodiment of the present invention has the same configuration in detail as the display device according to the second embodiment. The main difference from the display device according to the second embodiment is the configuration of the basic circuit SR of the shift transistor 112.

Figure 11:
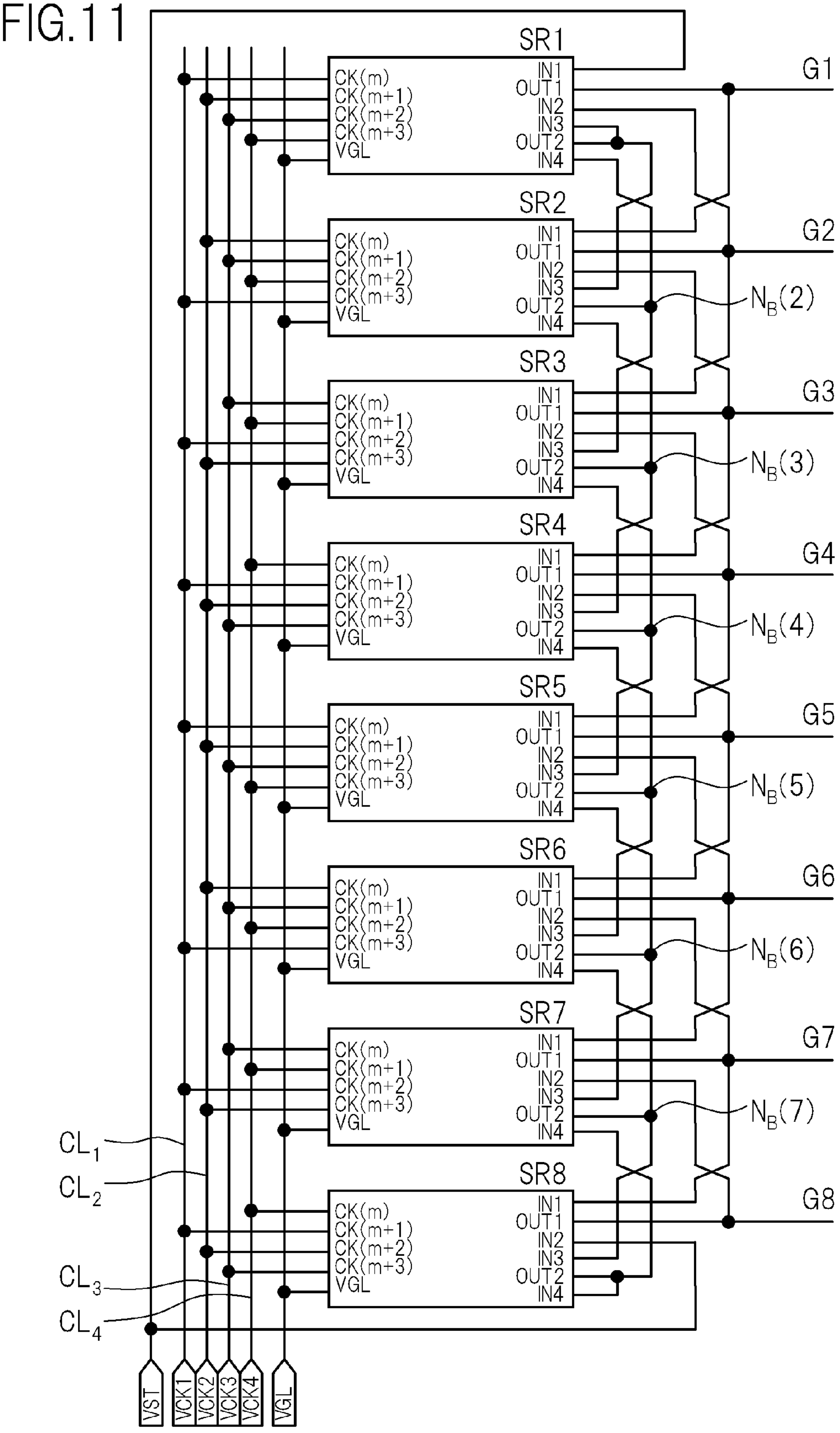
FIG. 11 is a block diagram of the shift register circuit according to a third embodiment of the present invention.

FIG. 11 is a block diagram of the shift register circuit 112 according to the embodiment. Similarly to FIG. 5, for brief description, when the shift register circuit 112 is composed of eight basic circuits SR arranged in a line is described.

The basic circuit SR is provided with four input terminals IN1, IN2, IN3, and IN4 and two output terminals OUT1 and OUT2. Similarly to the basic circuit SR shown in FIG. 5, the m-th basic circuit SR(m) outputs a gate signal $G_m$ from the output terminal OUT1 and inputs a gate signal $G_{m-1}$ and a gate signal $G_{m+1}$ to the two input terminals IN1 and IN2, respectively. Further, according to the embodiment, the m-th basic circuit SR(m) outputs the voltage $N_B$(m) of the node $N_B$ from the output terminal OUT2 while the voltage $N_B$(m−1) of the node $N_B$ output from the m−1-th basic circuit SR(m−1) and the voltage $N_B$(m+1) of the node $N_B$ output from the m+1-th basic circuit SR(m+1) are input to the input terminals IN3 and IN4, respectively. Further, the voltage $N_B$(1) of the node $N_B$ of the first basic circuit SR1 and the voltage $N_B$(8) of the node $N_B$ of the eighth basic circuit SR8 are input to the input terminal IN3 of the first basic circuit SR1 and the input terminal IN4 of the eighth basic circuit SR8, respectively.

Figure 12:
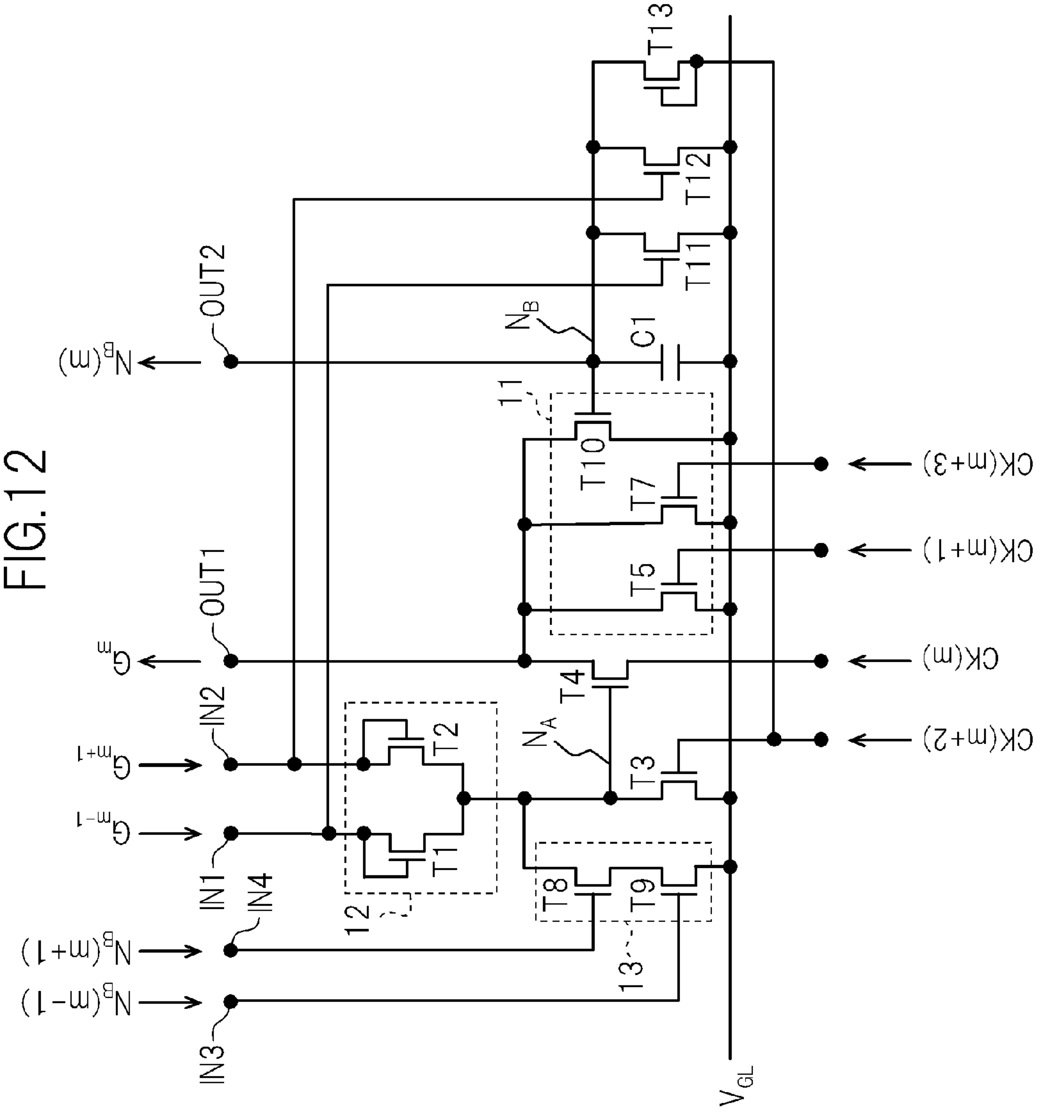
FIG. 12 is an m-th basic circuit of the shift register circuit according to the third embodiment of the present invention.

FIG. 12 is a circuit diagram of the m-th basic circuit SR(m) of the shift register circuit 112 according to the embodiment. The main difference from the m-th basic circuit SR(m) according to the second embodiment which is shown in FIG. 9 is the configuration of the second off-signal applying switching circuit and that voltages of the nodes $N_B$ of other basic circuits SR are used for the control of the second off-signal applying switching circuit.

The second off-signal applying switching circuit 13 is, similarly to the second embodiment, connected with the off-signal applying switching circuit T3 in parallel with respect to the node $N_A$. Further, according to the embodiment, the second off-signal applying switching circuit 13 is disposed such that a first switching element (transistor T9) and a second switching element (transistor T8) are connected in series, between the node $N_A$ and the low-voltage line $V_{GL}$.

Further, as described above, the m-th basic circuit SR(m) outputs the voltage $N_B$(m) of the node $N_B$ from the output terminal OUT2. Further, in the m-th basic circuit SR(m), the voltage $N_B$(m−1) of the node $N_B$ output from the m−1-th basic circuit SR(m−1) and the voltage $N_B$(m+1) of the node $N_B$ output from the m+1-th basic circuit SR(m+1) are input to the input terminals IN3 and IN4, respectively.

Gates of the two transistors T9 and T8 of the second off-signal applying switching circuit 13 are connected with the input terminals IN3 and IN4, respectively. The transistor T8 that is the second off-signal applying switching circuit according to the second embodiment which is shown in FIG. 9 is turned on, when the node $N_B$ becomes at a high voltage. On the other hand, the second off-signal applying switching circuit 13 according to the embodiment which is shown in FIG. 12 is turned on, when the voltage $N_B$(m−1) of the node $N_B$ of the m−1-th basic circuit SR(m−1) and the voltage $N_B$(m+1) of the node $N_B$ of the m+1-th basic circuit SR(m+1) both become a high voltage. That is, the second off-signal applying switching circuit 13 applies a low voltage of the low-voltage line $V_{GL}$ to the node $N_A$, only when the two transistors T8 and T9 connected in series are both at on-state.

Figure 13:
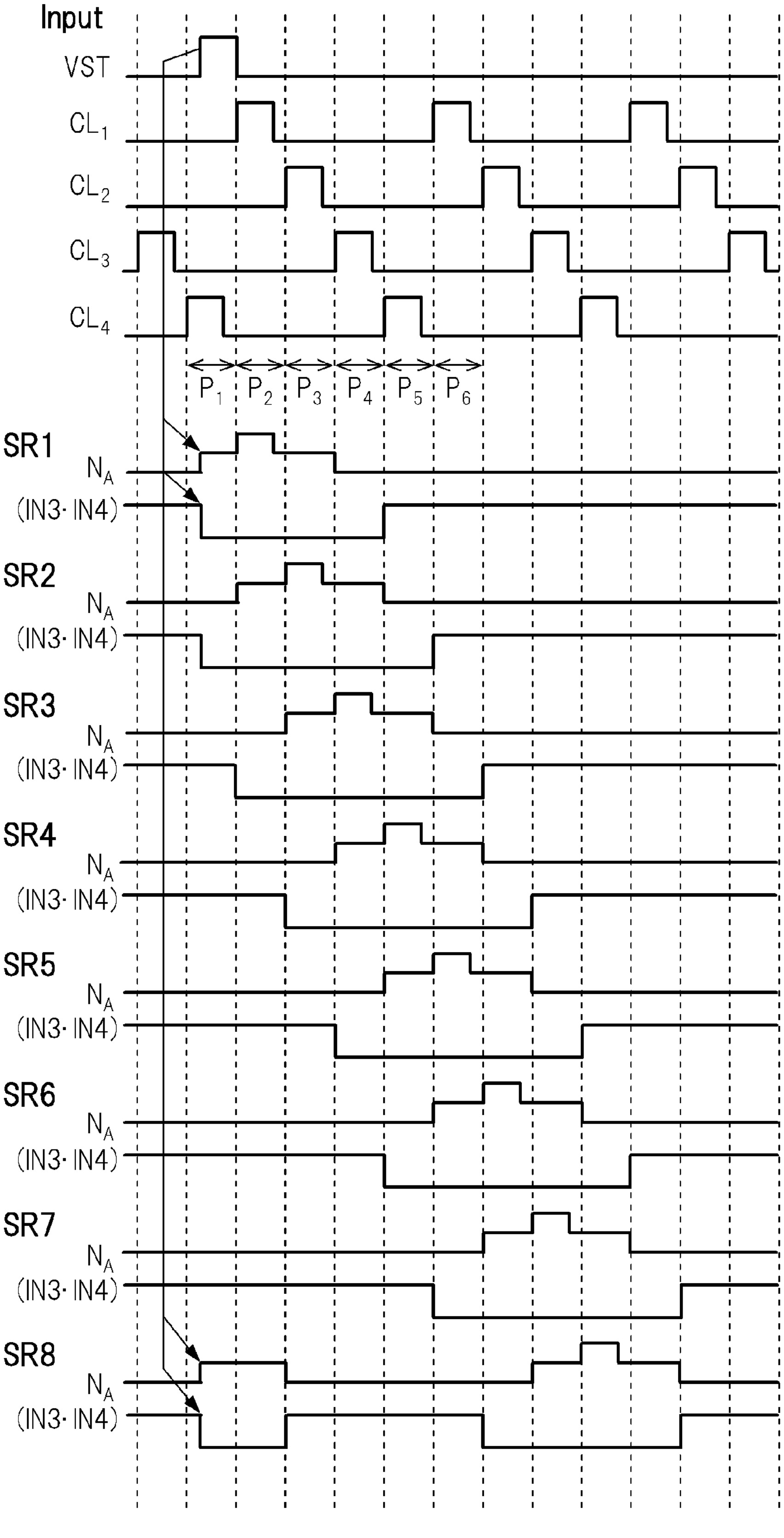
FIG. 13 is a view showing driving when the shift register according to the third embodiment of the present invention performs normal-directional scanning.

FIG. 13 is a view showing when the shift register circuit 112 according to the embodiment performs normal-directional scanning. FIG. 13 shows the input signals input to the basic circuit SR, the nodes $N_A$ of the basic circuits SR, and AND products of the input terminals IN3 and IN4 of the basic circuits SR with lapse of time in normal-directional scanning. The periods (clocks) indicated by arrows are $P_1$, $P_2$, $P_3$, $P_4$, $P_5$, and $P_6$. FIG. 13 shows the AND products of the input terminal IN3 and the input terminal IN4 of the basic circuits SR, as compared with the operation of the basic circuit SR according to the first embodiment which is shown in FIG. 7. The voltages of the input terminals IN3 and IN4 are 1 at a high voltage and 0 at a low voltage, and the AND product of the terminal IN3 and the terminal IN4 are 1 only when the input terminals IN3 and IN4 are both 1, and 0 in other cases.

As shown in FIG. 10, the voltage $N_B$(m) of the node $N_B$ of the m-th basic circuit SR(m) is at a low voltage in the period where the node $N_A$ of the m-th basic circuit SR(m) is at a high voltage, and is at a high voltage in other cases.

For example, the voltage $N_B$(1) is at a low voltage during the periods $P_1$, $P_2$, and $P_3$, and at a high voltage at the other periods. Similarly, the voltage $N_B$(2) is at a low voltage during the periods $P_2$, $P_3$, and $P_4$ and at a high voltage at the other periods while the voltage $N_B$(3) is at a low voltage during the periods $P_3$, $P_4$, and $P_5$ and at a high voltage at the other periods.

For the second basic circuit SR2, as an example, $N_B$(1) and $N_B$(3) are input to the input terminals IN3 and IN4 of the second basic circuit SR2, respectively. Accordingly, when the two transistors T8 and T9 of the second off-signal applying switching circuit 13 are both at on-state, the AND product of the input terminals IN3 and IN4 is 1, as described above, that is, the AND product of $N_B$ (1) and $N_B$(3) is 1.

As shown in FIG. 13, the AND product of $N_B$(1) and $N_B$(3) is 0 at the periods $P_1$ to $P_5$ and 1 at the other periods. The sub-signal $V_{ST}$ changes from a low voltage to a high voltage at a time in the period $P_1$, and at this time, $N_B$(1) changes from a high voltage to a low voltage and the AND product of $N_B$(1) and $N_B$(3) changes from 1 to 0. When the AND product of $N_B$(1) and $N_B$(3) is 1, the second off-signal applying switching 13 is at on-state and applies a low voltage to the node $N_A$. In contrast, at this time, the transistor T9 is turned off and the second off-signal applying switching 13 is turned off. While the AND product of $N_B$(1) and $N_B$(3) is 0, the gate signal $G_1$ input to the transistor T1 is at a high voltage at the period $P_2$. That is, since the second off-signal applying switching circuit 13 is turned off, the transistor T1 applies a high voltage of the gate signal $G_1$ to the node $N_A$ at the time when the period $P_2$ that is the next period (clock) starts.

Further, at the time when the period $P_5$ starts, the gate signal $G_3$ changes from a high voltage to a low voltage and the transistor T2 is turned off. In contrast, at the time when the period $P_6$ that is the next period (clock) starts, the AND product of $N_B$(1) and $N_B$(3) changes from 0 to 1 and the second off-signal applying switching circuit 13 is turned on and applies a low voltage to the node $N_A$.

As shown in FIG. 13, in general, the AND product of $N_B$(1) and $N_B$(3) changes from 1 to 0 and the node $N_A$ changes from a low voltage to a high voltage after one period (clock), in the basic circuit SR. Similarly, the node $N_A$ changes from a high voltage to a low voltage and the AND product of $N_B$(1) and $N_B$(3) changes from 0 to 1 after one period (clock).

In general, it takes a predetermined time to reach a sufficient off-state after the switching element is turned off. Similarly, it takes a predetermined time to reach a sufficient on-state after the switching element is turned on.

By setting a period until the on-signal applying circuit 12 is turned on after the second off-signal applying switching circuit 13 is turned off, the on-signal applying circuit 12 can be turned on after the second off-signal applying switching circuit 13 gets closer to the sufficient off-state, such that it is possible to suppress through-current that is generated when the second off-signal applying switching circuit 13 does not become at the sufficient off-state.

Further, FIG. 13 shows that in the first basic circuit SR1, the AND product of the input terminals IN3 and IN4 is the AND product of $N_B$ (1) and $N_B$ (2), and in the eighth basic circuit SR8, the AND product of the input terminals IN3 and IN4 is the AND product of $N_B$(7) and $N_B$(8), and a time change different from other basic circuits SR.

Fourth Embodiment

A display device according to a fourth embodiment of the present invention has the same configuration basically as the display device according to the third embodiment. The main difference from the display device according to the third embodiment is the configuration of the basic circuit SR of the shift transistor 112.

Figure 14:
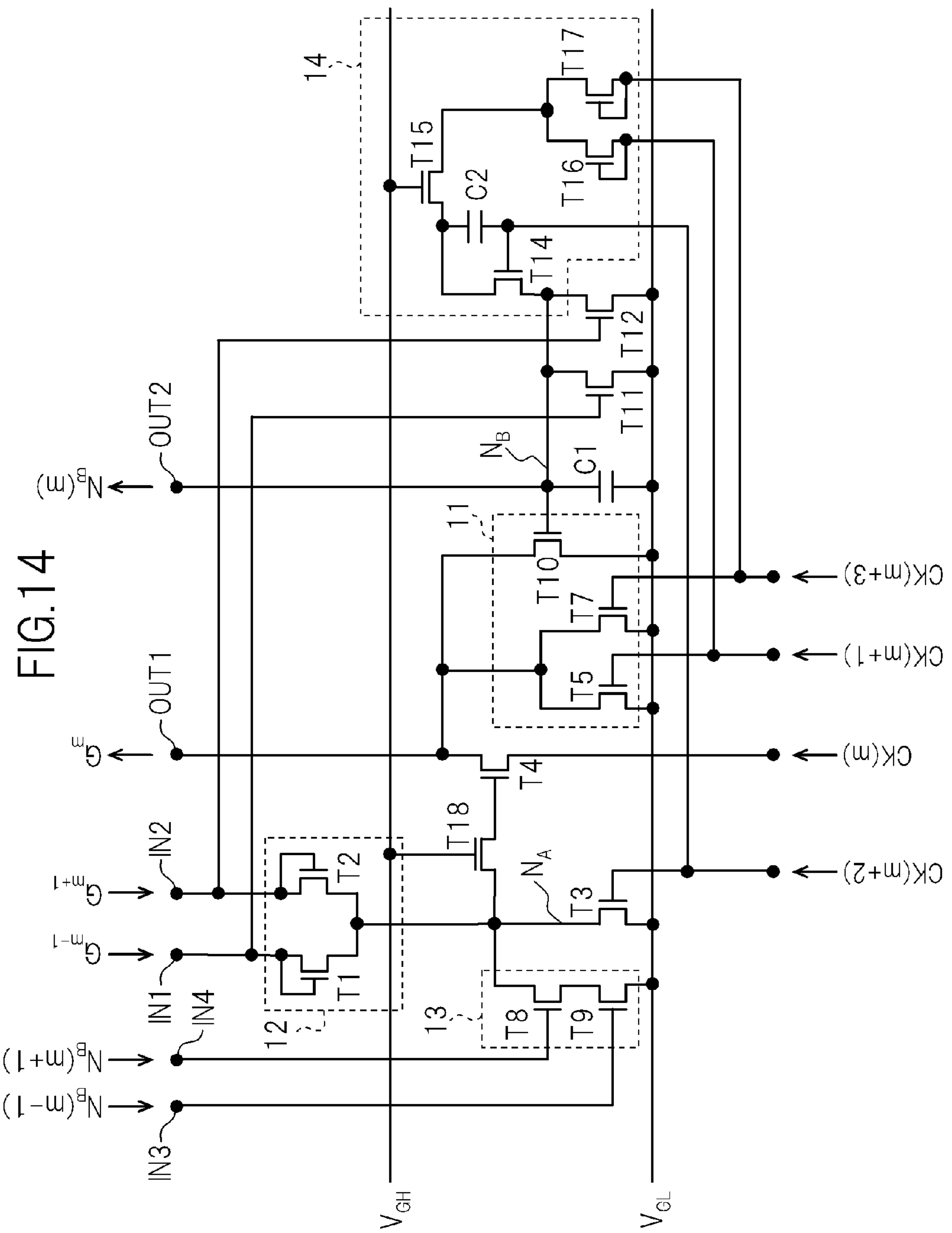
FIG. 14 is an m-th basic circuit of the shift register circuit according to a fourth embodiment of the present invention.

FIG. 14 is a circuit diagram of the m-th basic circuit SR(m) of the shift register circuit 112 according to the embodiment. The main difference from the m-th basic circuit SR(m) according to the third embodiment which is shown in FIG. 12 is that a charge pump circuit 14 is provided and a switching element T18 is disposed between the node $N_A$ and the high-voltage applying switching circuit (transistor T4). A high-voltage line $V_{GH}$ is connected to the m-th basic circuit SR(m), in addition to the low-voltage line $V_{GL}$. A voltage of the high-voltage line $V_{GH}$ is at a voltage higher than the high voltage of the clock signals CK(m).

The m-th basic circuit SR(m) according to the embodiment is provided with the charge pump circuit 14, as shown in FIG. 14, instead of the transistor T13 provided on the m-th basic circuit SR(m) shown in FIG. 12. The charge pump circuit 14 includes four transistors T14, T15, T16, and T17 and a boosting capacitance $C_2$. Two transistors T16 and T17 are diode-connected, and when the clock signals CK(m+1) and CK(m+3) input to the transistors, respectively, become at a high voltage, the transistors T16 and T17 apply a high voltage to an input side of the transistor T15.

The high-voltage line $V_{GH}$ is connected to a gate of the transistor T15 and the transistor T15 is a common gate transistor. An input side of the transistor T14 is connected to an output side of the transistor T15. A gate of the transistor T14 is connected to the clock signal CK(m+2) and an output side of the transistor T14 is connected to the node $N_B$. The boosting capacitance $C_2$ is disposed between the input side and the gate of the transistor T14.

According to this configuration, when the clock signals CK(m+1) and CK(m+3) become at a high voltage, the boosting capacitance $C_2$ is charged, and when the clock signals CK(m+2) becomes at a high voltage, the node $N_B$ can be boosted to a voltage higher than the high voltage of the clock signal CK(m) by capacity coupling of the boosting capacitance $C_2$. Further, the clock signal lines connected to the charge pump circuit 14 is other clock signal lines that is not the clock signal line connected to the high-voltage applying switching circuit.

Further, the transistor T18 (switching element) is disposed between the node $N_A$ and the switch of the high-voltage applying switching circuit (transistor T4) and the high-voltage line $V_{GH}$ is connected to a gate of the transistor T18 and the transistor T18 is a common gate transistor. As the transistor T18 is disposed, it is possible to suppress abnormal increase in voltage of the node $N_A$ through the transistor T18, even if the voltage of the gate of the transistor T4 is increased by bootstrap voltage.

Fifth Embodiment

It was described above that 4-phase clock signals are input to the basic circuits SR of the shift register circuit 112 disposed in the gate signal line driving circuit 104 according to the embodiments of the present invention. However, it is not limited to the 4-phase clock signals.

According to the present invention, the switch (gate) of the off-signal applying switching circuit (transistor T3) applying an off-voltage to the node $N_A$ applied to the switch of the high-voltage applying switching circuit by using a clock signal having an inverse phase of that of the clock signal input to the input side of the high-voltage applying switching circuit (transistor T4) supplying a high voltage to the gate signal $G_m$.

The off-signal applying switching circuit applies an off-voltage to the node $N_A$ (reset state), with the switch of the off-signal applying switching circuit turned on, every time the clock signal with an inverse phase becomes at a high voltage. Since the output gate signal $G_m$ becomes at a high voltage in the signal-high period, the on-signal applying circuit needs to apply an on-voltage (on-signal) to the node $N_A$ before the clock signal with an inverse phase becomes at a high voltage again after becoming at a high voltage.

When the signal-high period of the gate signal $G_m$ is the m-th clock, the node $N_A$ needs to become at the on-voltage at the m-th clock. When 4-phase clock signals are used, the clock signal with an inverse phase becomes at a high voltage both at the m−2-th clock and the m+2-th clock, around the m-th clock. The operation of the on-signal applying circuit applying an on-voltage to the node $N_A$ needs to be performed both at the m−1-th clock and the m+1-th clock in order to cope with normal-directional scanning is performed and and with inverse-directional scanning is performed. The gate signal line driving circuits 104 according to the first to fourth embodiments use 4-phase clock signals and the on-signal applying circuits apply an on-voltage to the node $N_A$ both at the m−1-th clock and the m+1-th clock by the gate signal $G_{m-1}$ of the former stage and the gate signal $G_{m+1}$ of the later stage, that is, at the timing when any one of the two gate signals becomes a high voltage.

However, it is further possible to dispose a circuit with a high degree of freedom by using 2n-phase clock signals (n is a natural number of 2 or more). For example, when n is 3, that is, when 6-phase clock signals are used, the signal-high period of the gate signal $G_m$ is the m-th clock and the clock signal with an inverse phase becomes at a high voltage at the m−3-th clock and the m+3-th clock, around the m-th clock. The on-signal applying circuit may apply an on-voltage to the node $N_A$ in any one of the m−1-th clock and the m−2-th clock if it is before the m-th clock. Similarly, it may be in any one of the m+1-th clock and the m+2-th clock if it is after the m-th clock.

In general, the signal-high period of the gate signal $G_m$ is the m-th clock and the clock signal with an inverse phase becomes at a high voltage at the m−n-th clock and the m+n-th clock. It is necessary to perform the operation of the on-signal applying circuit applying an on-voltage to the node $N_A$ at at least one period (clock) between the m−(n−1)-th clock and the m−1-th clock. Similarly, it is necessary to perform the operation at at least one period (clock) between the m+1-th clock and the m+(n−1)-th clock in consideration of the symmetry of bidirectional scanning.

The clock signal lines $CL_{2n}$ connected to the input sides of the high-voltage applying switching circuits (transistors T4) of a plurality of basic circuits SR are described herein. The 2n-phase clock signals that become sequentially at a high voltage are respectively input to the clock signal lines $CL_{2n}$ connected to the input sides of the high-voltage applying switching circuits of the plurality of basic circuits SR, in the normal order of the sequence for normal-directional scanning. The 2n clock signal lines are connected to the high-voltage applying switching circuits of the plurality of basic circuits SR repeated in the sequence in accordance with the normal order and it is possible to give numbers to the plurality of basic circuits SR in accordance with the this order.

For example, at the m−i-th clock, the gate signal $G_{m-i}$ may be input to the on-signal applying circuit in order to perform operation of the on-signal applying circuit of applying an on-voltage to the node $N_A$ between the m−(n−1)-th clock and the m−1-th clock. Similarly, for example, at the m+i-th clock, the gate signal $G_{m+i}$ may be input to the on-signal applying circuit in order to perform the operation between the m+1-th clock and the m+(n−1)-th clock. Note that i is a natural number of 1 or more and n−1 or less. That is, the gate signal of the i-th basic circuit (one of the first to n−1-th basic circuits) backing in the inverse order of the ordered sequence from the basic circuit SR and the gate signal of the i-th basic circuit (one of the first to n−1-th basic circuits) preceding in the normal order of the ordered sequence from the basic circuit may be input to the on-signal applying circuit.

For example, in the on-signal applying circuit 12 shown in FIG. 6, although the transistor T1 where the gate signal $G_{m-1}$ is input and the transistor T2 where the gate signal $G_{m+1}$ is input are connected in parallel with respect to the node $N_A$, the two transistors are not limited to the parallel connection and more number of transistors may be connected in parallel to the on-signal applying circuit. In this case, it is desirable to select the gate signal $G_{m+i}$ and $G_{m-i}$ to be symmetric with respect to m that is the center, in consideration of symmetry. Further, when the on-signal applying circuit can apply an on-voltage to the node $N_A$ sufficiently in one clock, it is preferable that the gate signals $G_{m-1}$ and $G_{m+1}$ are input to the on-signal applying circuit.

Further, the low-voltage applying switching circuit that applies a low voltage to the output terminal in accordance with the signal-low period may be the same as the low-voltage applying switching circuit 11 shown in FIG. 6. When 2n-phase clock signals are used, all or some of the 2n−1 clock signals, other than the clock signal input to the high-voltage applying switching circuit, may be connected to the switches of a plurality of low-voltage applying switching elements connected in parallel, if necessary.

Further, the low-voltage applying switching circuit may be the same as the low-voltage applying switching circuit 11 shown in FIG. 9. The node $N_B$ that is a control signal may be connected to the switch of at least one low-voltage applying switching element of the plurality of low-voltage applying switching elements. The node $N_B$ is a control signal that becomes at an on-voltage in accordance with the signal-low period and becomes at an off-voltage in accordance with the signal-high period. The gate signals $G_{m-i}$ and $G_{m+i}$ may be used when changing the node $N_B$ to the off voltage in accordance with the signal-high period.

Further, the second off-signal applying switching circuit connected in parallel with the off-signal applying switching circuit through the node $N_A$ may be the same as the second off-signal applying switching circuit shown in FIG. 9. The node $N_B$ may be connected to the switch of the second off-signal applying switching circuit.

Further, in the shift register circuit 112 according to the embodiment, as shown in FIG. 4, it was described when a plurality of basic circuits SR are disposed at both sides of the display unit 120. The basic circuits SR provided in the gate signal line driving circuit 104 may be formed in a narrow frame by being disposed at both sides of the display unit 120. However, for example, they may be disposed at one side of the display unit 120. Further, the shift register circuit 112 according to the embodiment where 4-phase clock signals $VCK_n$ are input may be disposed at one side of the display unit 120 and the shift register circuit where other 4-phase block signals $VCK_n$ deviated as much as the half-clock of the 4-phase clock signals are input may be disposed at another side of the display unit 120 such that gate signals with half clocks overlapping are output by the shift register circuits at the left and right sides. Further, the present invention can be applied to the other cases.

Figure 15:
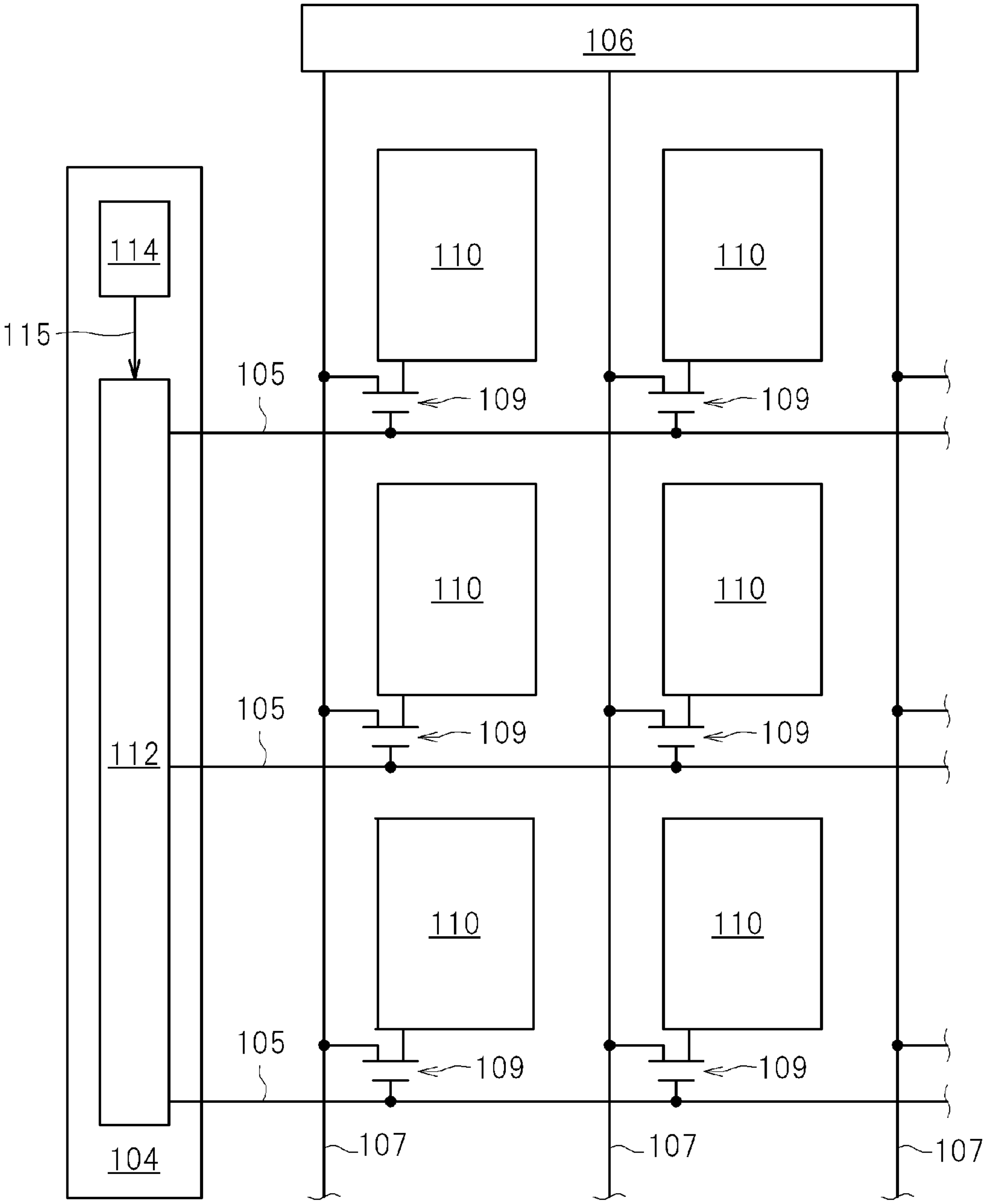
FIG. 15 is a conceptual view of an equivalent circuit of a TFT substrate mounted in a liquid crystal display that is another example according to an embodiment of the present invention.

Further, in a display device according to an embodiment of the present invention, although an IPS liquid crystal display, as shown in FIG. 3, was described above, the display device according to the present invention may be liquid crystal displays having different driving types, such as a VA (Vertically Aligned) or a TN (Twisted Nematic) liquid crystal display, or other display devices, such as an organic EL display. FIG. 15 is a conceptual diagram of an equivalent circuit of the TFT substrate 102 provided in a VA or TN liquid crystal display. In the VA or TN liquid crystal display, the common electrode 111 is disposed at the filter substrate 101 opposite to the TFT substrate 102.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A gate signal line driving circuit comprising:

2n clock signal lines (n is a natural number of 2 or more) where 2n-phase clock signals, which have different phases at a predetermined cycle and sequentially become at a high voltage, are input in the normal order of the sequence in normal-directional scanning and in the inverse order of the sequence in inverse-directional scanning, respectively; and a plurality of basic circuits, each being connected with at least some of the 2n clock signal lines and outputting a gate signal, which becomes at a high voltage at a signal-high period and becomes at a low voltage at a signal-low period that is a period other than the signal-high period, from an output terminal, wherein each of the basic circuits comprises:

a high-voltage applying switching circuit where one clock signal line out of the 2n clock signal lines is connected to an input side and applies a voltage applied to the clock signal line to the output terminal at on-state, and an off-signal applying switching circuit that applies an off-voltage to a switch of the high-voltage applying switching circuit at on-state, and a clock signal line where a clock signal having an inverse phase of the clock signal input to the clock signal line is input is connected to a switch of the off-signal applying switching circuit.

2. The gate signal line driving circuit according to claim 1, wherein the 2n clock signal lines are connected to the high-voltage applying switching circuits of the plurality of basic circuits repeated in the sequence in accordance with the normal order, each of the basic circuits further comprises an on-signal applying circuit that applies an on-voltage to a switch of the high-voltage applying switching circuit, and in the on-signal applying circuit of each of the basic circuits, where the gate signal of one basic circuit of first to n−1-th basic circuits backing in the inverse order of the sequence from the basic circuit and the gate signal of one basic circuit of first to n−1-th basic circuits preceding in the normal order of the sequence from the basic circuit are input, to become turned on at a timing where one of the two gate signals becomes at a high voltage.

3. The gate signal line driving circuit according to claim 2, wherein each of the basic circuits further comprises a low-voltage applying switching circuit that applies a low voltage to the output terminal, the low-voltage applying switching circuit comprises a plurality of low-voltage applying switching elements that is connected in parallel with respect to the output terminal and each applies a low voltage to the output terminal, and a control signal that becomes at an on-voltage in accordance with the signal-low period and becomes at an off-voltage in accordance with the timing where one of the gate signals becomes at a high voltage is applied to a switch of one low-voltage applying switching element.

4. The gate signal line driving circuit according to claim 3, wherein the control signal becomes at an off-voltage by the gate signal of one basic circuit of first to n−1-th basic circuits backing in the inverse order of the sequence from the basic circuit and the gate signal of one basic circuit of first to n−1-th basic circuits preceding in the normal order of the sequence from the basic circuit.

5. The gate signal line driving circuit according to claim 4, wherein each of the basic circuits further comprises a second off-signal applying switching circuit that is connected in parallel with the off-signal applying switching circuit with respect to the switch of the high-voltage applying switching circuit, and the control signal is applied to the switch of the second off-signal applying switching circuit.

6. The gate signal line driving circuit according to claim 3, wherein each of the basic circuits further comprises a second on-signal applying switching circuit that is connected in parallel with the off-signal applying switching circuit with respect to the switch of the high-voltage applying switching circuit, and the control signal is applied to the switch of the second off-signal applying switching circuit.

7. The gate signal line driving circuit according to claim 1, wherein each of the basic circuits further comprises a low-voltage applying switching circuit that applies a low voltage to the output terminal, the low-voltage applying switching circuit comprises a plurality of low-voltage applying switching elements that is connected in parallel with respect to the output terminal and each applies a low voltage to the output terminal, and one of the other block signal lines that are not the clock signal line connected to the high-voltage applying switching circuit is connected to a switch of the low-voltage applying switching element.

8. A display device including the gate signal line driving circuit according to claim 1.

9. A gate signal line driving circuit comprising:

four clock signal lines where 4-phase clock signals, which have different phases at a predetermined cycle and sequentially become at a high voltage, are input in the normal order of the sequence in normal-directional scanning and in the inverse order of the sequence in inverse-directional scanning, respectively; and a plurality of basic circuits, each being connected with the four clock signal lines and outputting a gate signal, which becomes at a high voltage at a signal-high period and becomes at a low voltage at a signal-low period that is a period other than the signal-high period, from an output terminal, wherein each of the basic circuits comprises:

a high-voltage applying switching circuit where one clock signal line out of the four clock signal lines is connected to an input side and applies a voltage applied to the clock signal line to the output terminal at on-state, and an off-signal applying switching circuit that applies an off-voltage to a switch of the high-voltage applying switching circuit at on-state, and a clock signal line where a clock signal having an inverse phase of the clock signal input to the clock signal line is input is connected to a switch of the off-signal applying switching circuit.

10. The gate signal line driving circuit according to claim 9, wherein the four clock signal lines are connected to the high-voltage applying switching circuits of the plurality of basic circuits repeated in the sequence in accordance with the normal order, each of the basic circuits further comprises an on-signal applying circuit that applies an on-voltage to a switch of the high-voltage applying switching circuit, and in the on-signal applying circuit of each of the basic circuits, where the gate signal of a basic circuit at a former stage of the basic circuit and the gate signal of a basic circuit at a later stage of the basic circuit are input, to become turned on at a timing where one of the two gate signals becomes at a high voltage.

11. The gate signal line driving circuit according to claim 10, wherein each of the basic circuits further comprises a low-voltage applying switching circuit that applies a low voltage to the output terminal, the low-voltage applying switching circuit comprises a plurality of low-voltage applying switching elements that is connected in parallel with respect to the output terminal and each applies a low voltage to the output terminal, and a control signal that becomes at an on-voltage in accordance with the signal-low period and becomes at an off-voltage in accordance with the timing where one of the gate signals becomes at a high voltage is applied to a switch of one low-voltage applying switching element.

12. The gate signal line driving circuit according to claim 11, wherein the control signal becomes at an off-voltage by one of the gate signal of the basic circuit at the former stage of the basic circuit and the gate signal of the basic circuit at the later stage of the basic circuit, in the on-signal applying circuit of each of the basic circuits.

13. The gate signal line driving circuit according to claim 12, wherein each of the basic circuits further comprises a second off-signal applying switching circuit that is connected in parallel with the off-signal applying switching circuit with respect to the switch of the high-voltage applying switching circuit, and the control signal is applied to the switch of the second off-signal applying switching circuit.

14. The gate signal line driving circuit according to claim 12, wherein each of the basic circuits further comprises a second off-signal applying switching circuit that is connected in parallel with the off-signal applying switching circuit with respect to the switch of the high-voltage applying switch circuit and that comprises first and second switching elements in series, and the control signal of the basic circuit at the former stage of the basic circuit is applied to a switch of the first switching element and the control signal of the basic circuit at the later stage of the basic circuit is applied to a switch of the second switching element.

15. The gate signal line driving circuit according to claim 12, wherein each of the basic circuits further comprises a charge pump circuit that is connected with another clock signal that is not the clock signal connected to the high-voltage applying switching circuit and increases the voltage of the control signal.

16. The gate signal line driving circuit according to claim 11, wherein each of the basic circuits further comprises a second off-signal applying switching circuit that is connected in parallel with the off-signal applying switching circuit with respect to the switch of the high-voltage applying switching circuit, and the control signal is applied to the switch of the second off-signal applying switching circuit.

17. The gate signal line driving circuit according to claim 11, wherein each of the basic circuits further comprises a second off-signal applying switching circuit that is connected in parallel with the off-signal applying switching circuit with respect to the switch of the high-voltage applying switch circuit and that comprises first and second switching elements in series, and the control signal of the basic circuit at the former stage of the basic circuit is applied to a switch of the first switching element and the control signal of the basic circuit at the later stage of the basic circuit is applied to a switch of the second switching element.

18. The gate signal line driving circuit according to claim 11, wherein each of the basic circuits further comprises a charge pump circuit that is connected with another clock signal that is not the clock signal connected to the high-voltage applying switching circuit and increases the voltage of the control signal.

19. The gate signal line driving circuit according to claim 9, wherein each of the basic circuits further comprises a low-voltage applying switching circuit that applies a low voltage to the output terminal, the low-voltage applying switching circuit comprises three low-voltage applying switching elements that are connected in parallel with respect to the output terminal and each applies a low voltage to the output terminal, and one of the other block signal lines that are not the clock signal line connected to the high-voltage applying switching circuit is connected to a switch of the low-voltage applying circuit element.

* * * * *